(12) United States Patent
Yoon et al.

(10) Patent No.: US 10,050,052 B2
(45) Date of Patent: Aug. 14, 2018

(54) SEMICONDUCTOR DEVICE AND MANUFACTURING METHOD FOR THE SAME

(71) Applicant: SK hynix Inc., Gyeonggi-do (KR)

(72) Inventors: Myeong Seong Yoon, Incheon (KR); Il Seok Seo, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/231,269

(22) Filed: Aug. 8, 2016

(65) Prior Publication Data

US 2017/0256559 A1 Sep. 7, 2017

(30) Foreign Application Priority Data

Mar. 4, 2016 (KR) ........................ 10-2016-0026537

(51) Int. Cl.
*H01L 27/115* (2017.01)
*H01L 21/28* (2006.01)
*H01L 21/311* (2006.01)
*H01L 27/11578* (2017.01)
*H01L 27/11565* (2017.01)
H01L 27/11582 (2017.01)

(52) U.S. Cl.
CPC .. *H01L 27/11578* (2013.01); *H01L 21/28282* (2013.01); *H01L 21/31144* (2013.01); *H01L 27/11565* (2013.01); *H01L 27/11582* (2013.01)

(58) Field of Classification Search
CPC .................................................. H01L 29/7926
See application file for complete search history.

(56) References Cited

U.S. PATENT DOCUMENTS

2013/0153978 A1* 6/2013 Lee ................... H01L 29/66833
257/314
2013/0320424 A1* 12/2013 Lee ..................... H01L 27/1158
257/314

FOREIGN PATENT DOCUMENTS

KR 1020150044878 4/2015

* cited by examiner

*Primary Examiner* — Su C Kim
*Assistant Examiner* — David S Wilbert
(74) *Attorney, Agent, or Firm* — IP & T Group LLP

(57) ABSTRACT

A semiconductor device includes interlayer insulating layers and conductive patterns alternately stacked over a pipe gate, a first slit and a second slit penetrating the interlayer insulating layers and the conductive patterns and crossing each other, an etch stop pad groove overlapping an intersection of the first slit and the second slit, arranged in the pipe gate, and connected to the first slit or the second slit, and slit insulating layers filling the first slit, the second slit and the etch stop pad groove.

10 Claims, 24 Drawing Sheets

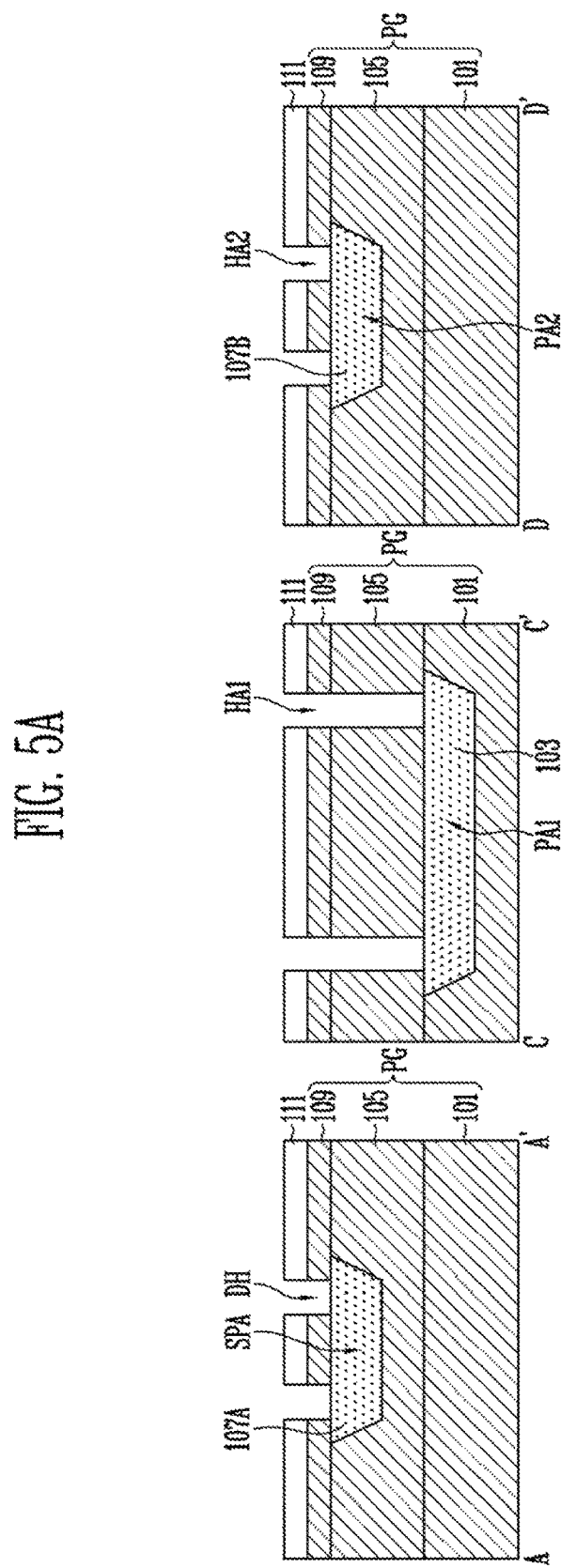

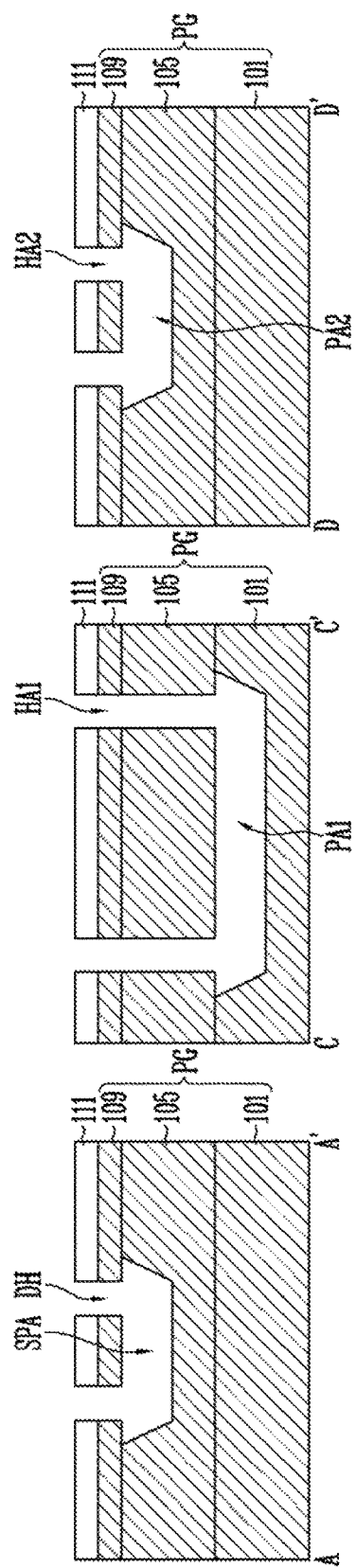

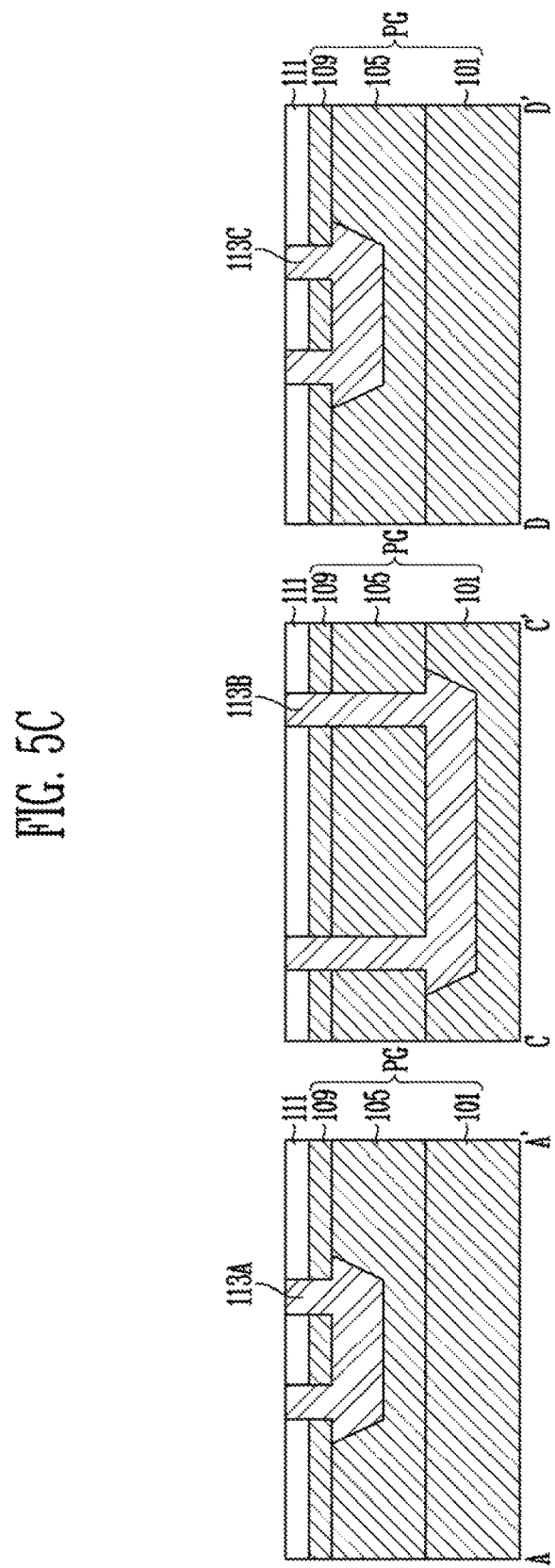

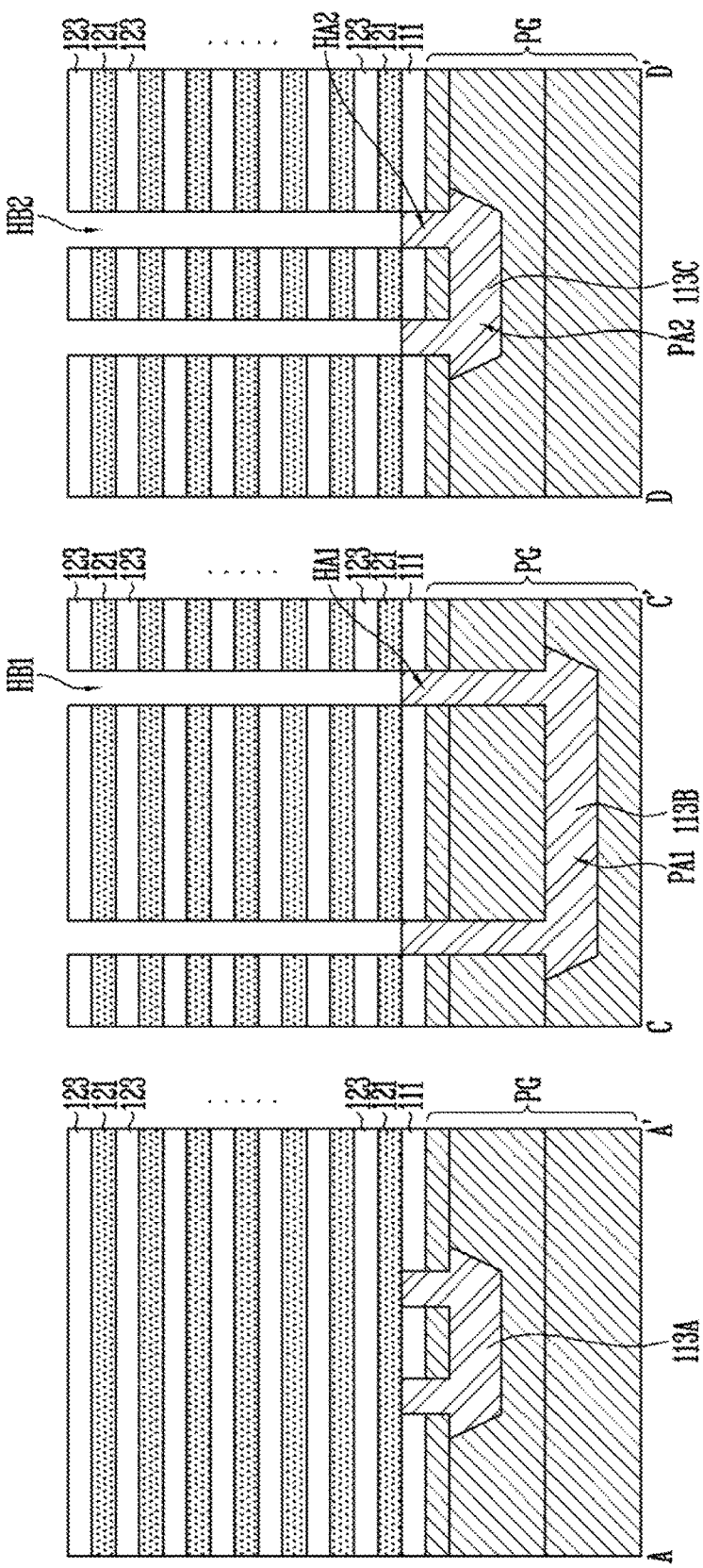

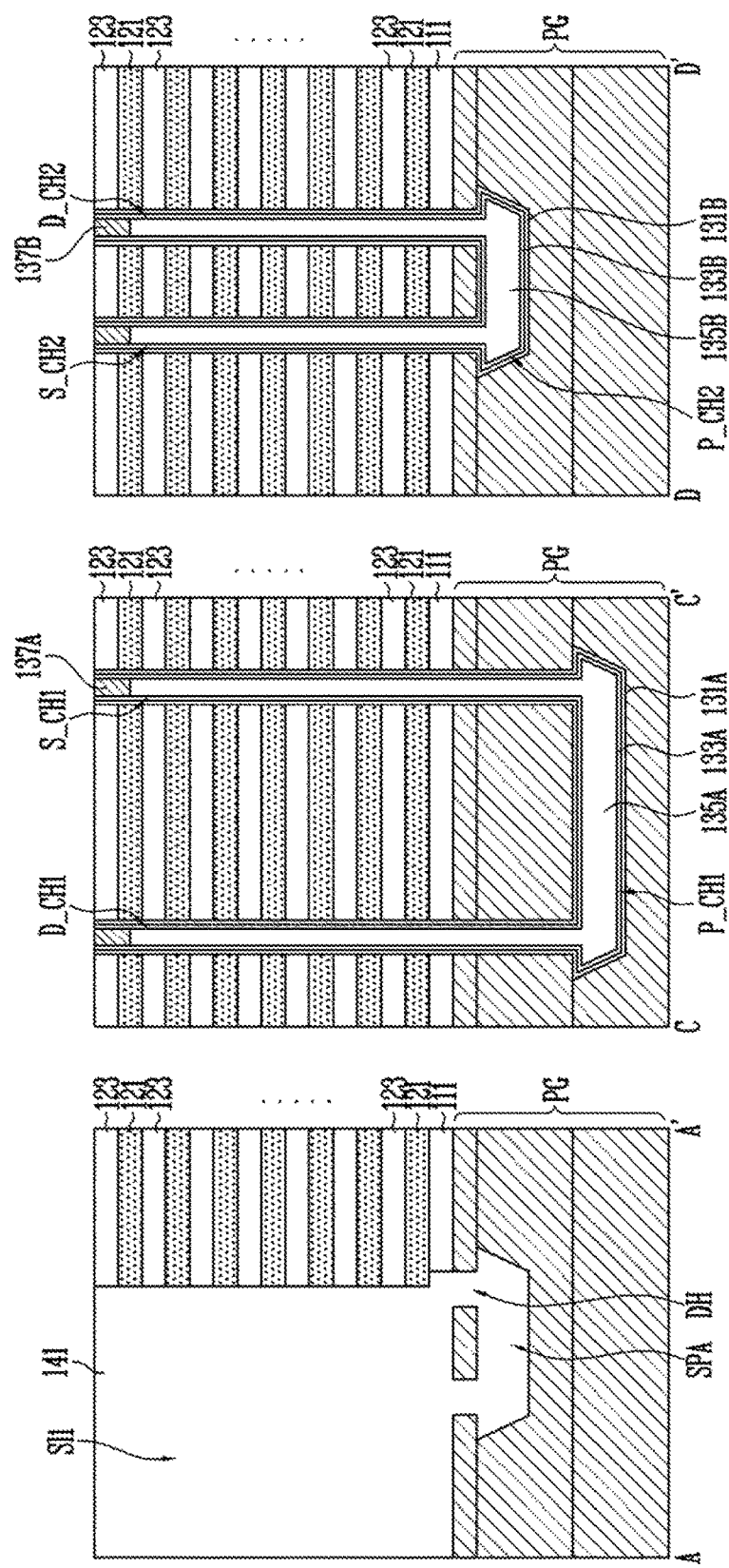

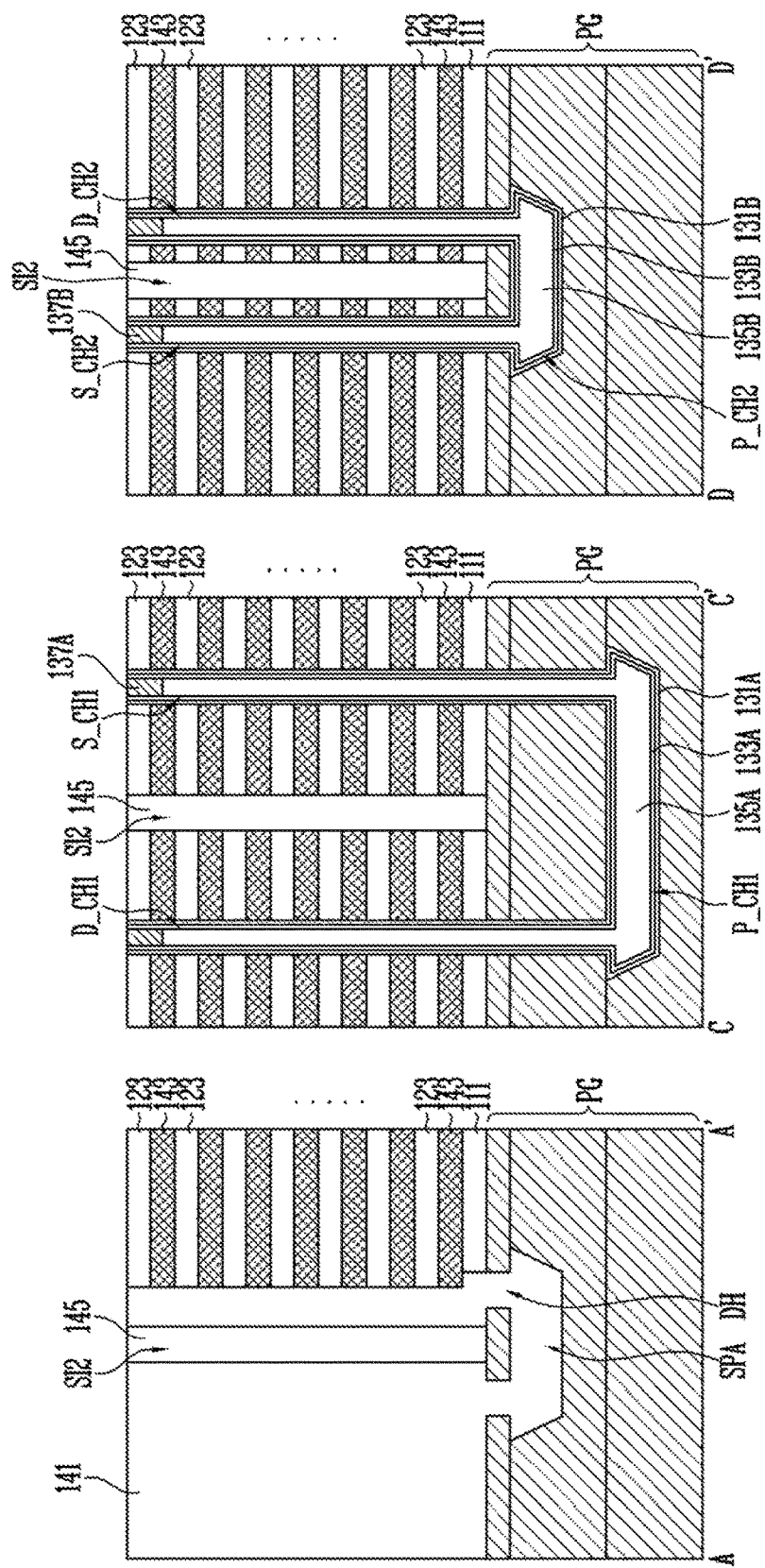

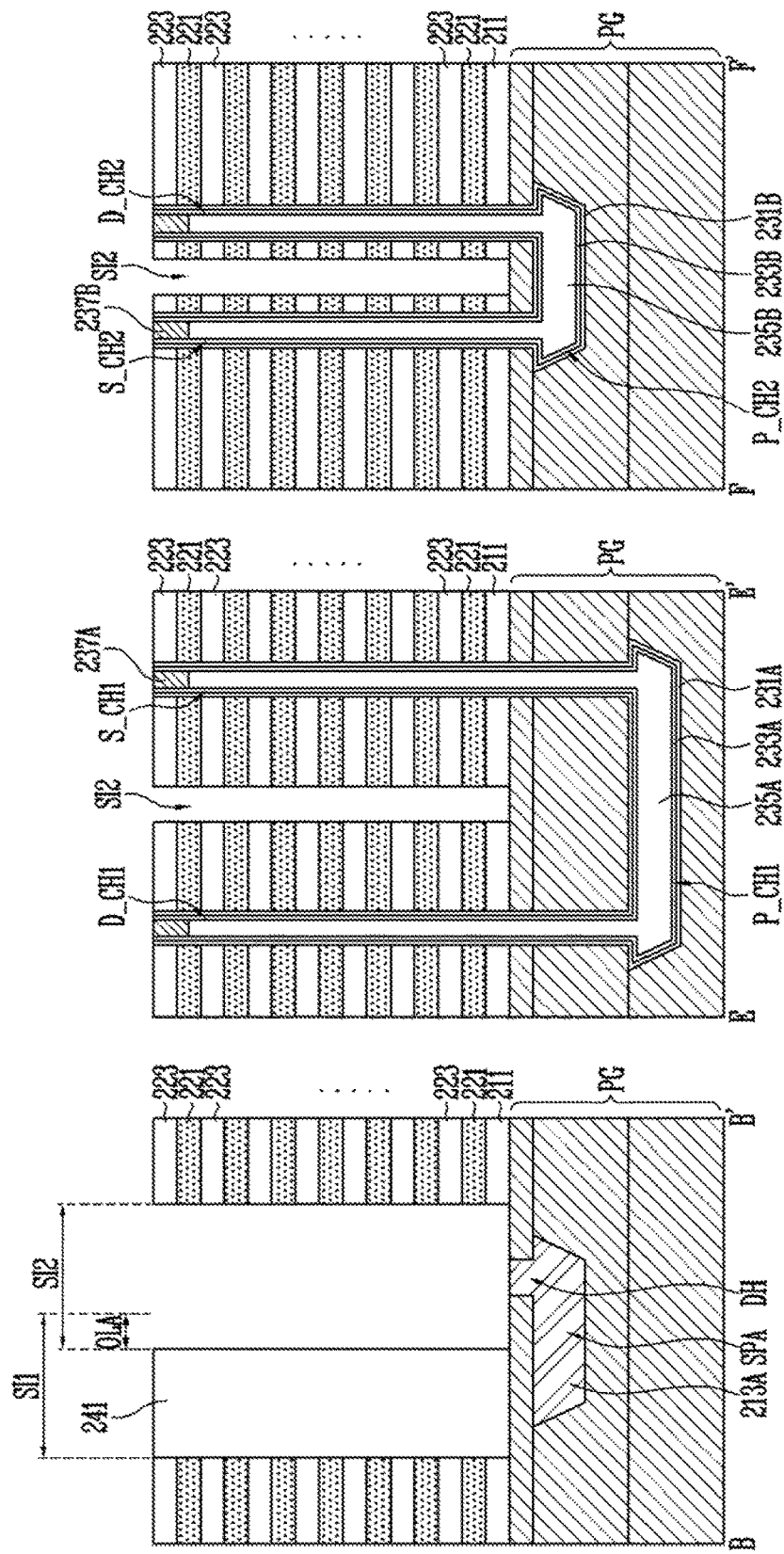

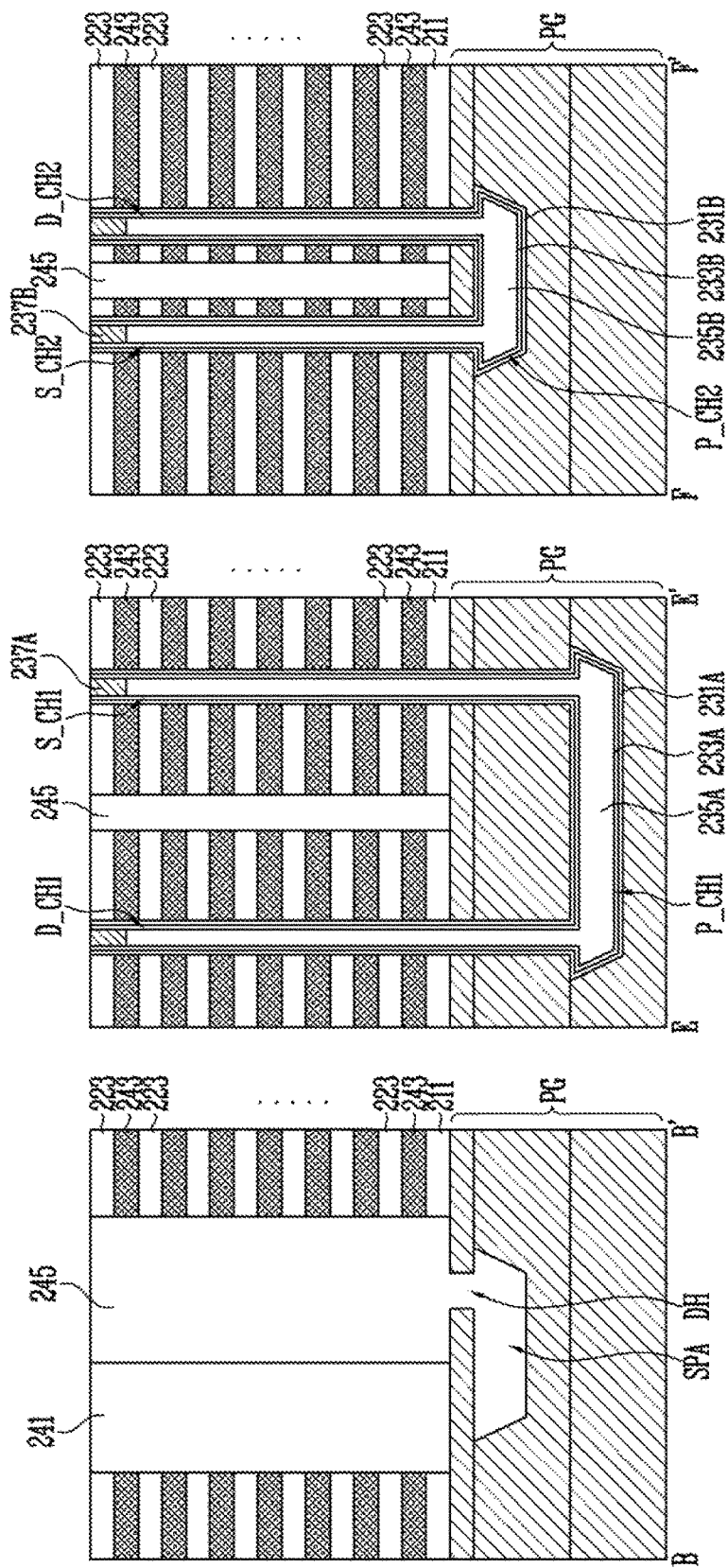

SEMICONDUCTOR DEVICE AND MANUFACTURING METHOD FOR THE SAME

CROSS REFERENCE TO RELATED APPLICATION

The present application claims a priority to a Korean patent application number 10-2016-0026537 filed on Mar. 4, 2016, the entire disclosure of which is incorporated herein by reference in its entirety.

BACKGROUND

1. Technical Field

Embodiments of the present disclosure generally relate to a semiconductor device and a manufacturing method thereof, more particularly, to a three dimensional memory device and a method for manufacturing the same.

2. Discussion of Related Arts

The semiconductor device may include a memory device that stores data. The memory device may include memory cells. For a high integration of the semiconductor device, the memory cells may be arranged in three dimensions. The memory cells arranged in three dimensions may be coupled to conductive patterns arranged at different heights from each other. The conductive patterns may be penetrated by slits formed in a variety of shapes.

The slits described above may overlap with each other. A substrate may be damaged by an over etch in an area in which the slits overlap with each other, or a bottom of the slit may be too close to the substrate. In this case, a leakage current occurs to the substrate through a conductive material that remains in the bottom of the slit, such that operational reliability of the semiconductor device may be reduced.

SUMMARY

Various embodiments are directed to a semiconductor device capable of improving an operational reliability of the semiconductor device, and a manufacturing method thereof.

In one aspect of the present disclosure, there is provided a semiconductor device including interlayer insulating layers and conductive patterns alternately stacked over a pipe gate, a first slit and a second slit penetrating the interlayer insulating layers and the conductive patterns and crossing each other, an etch stop pad groove overlapping an intersection of the first slit and the second slit, arranged in the pipe gate, and connected to the first slit or the second slit, and slit insulating layers filling the first slit, the second slit and the etch stop pad groove.

In one aspect of the present disclosure, there is provided a manufacturing method for a semiconductor device, the manufacturing method including forming a pipe gate in which an etch stop pad groove filled with an etch stop pattern is formed, alternately stacking first material layers and second material layers over the pipe gate, forming a first slit penetrating the first material layers and the secondmaterial layers and overlapping the etch stop pattern, opening the etch stop pad groove by removing the etch stop pattern through the first slit, forming a first slit insulating layer filling the first slit and the etch stop pad groove, and forming a second slit penetrating the first material layers and the second material layers, the second slit crossing the first slit in an overlapping portion of the first slit and the etch stop pad groove.

In one aspect of the present disclosure, there is provided a manufacturing method for a semiconductor device, the manufacturing method including forming a pipe gate in which an etch stop pad groove filled with an etch stop pattern is formed, alternately stacking first material layers and second material layers over the pipe gate, forming a first slit penetrating the first material layers and the second material layers and overlapping the etch stop pattern, forming a first slit insulating layer in the first slit, forming a second slit penetrating the first material layers and the second material layers, the second slit intersecting the first slit in an overlapping portion of the first slit and the etch stop pad groove, removing the etch stop pattern through the second slit, and forming a second slit insulating layer filing the second silt and the etch stop pad groove.

BRIEF DESCRIPTION OF THE DRAWINGS

FIGS. 5A to 8C illustrate cross sectional views of a manufacturing method of a memory device according to an embodiment of the present disclosure.

DETAILED DESCRIPTIONS

Embodiments are provided to transfer the spirit and the scope of the disclosure to those skilled in the art to which the disclosure pertains. Accordingly, it will be understood by those of skill in the art that various changes in form and details may be made without departing from the spirit and scope of the disclosure as set forth in the following claims. Therefore, the technical range of the present disclosure is not limited to the detailed description of the specification but defined by the range of the claims.

The present disclosure provides a semiconductor device improving an operational reliability thereof, and a method for manufacturing the same.

Figure 1:
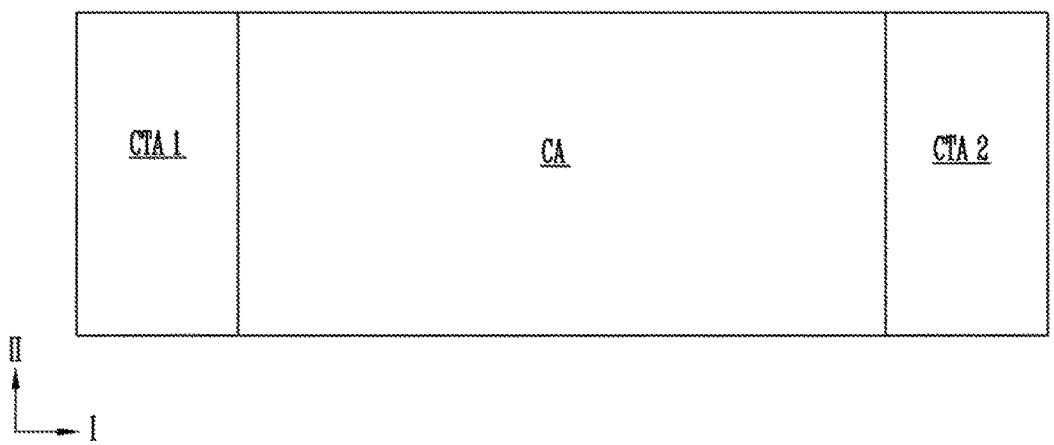
FIG. 1 illustrates a view of a cell area and a contact area of a memory device according to an embodiment of the present disclosure.

FIG. 1 illustrates a view of a cell area and a contact area of a memory device according to an embodiment of the present disclosure.

Referring to FIG. 1, the memory device according to the embodiment of the present disclosure may be formed over a substrate, the substrate including a cell area CA and contact areas CTA1 and CTA2 extending along a first direction I from the cell area CA.

A cell array may be arranged on a cell area CA. The cell array may include memory blocks. Each of the memory blocks may include memory cells. Each of the memory cells may store one or more bits. The memory cells may be connected in series through a channel layer to form a memory string. One end of the channel layer may be connected to a bit line, and the other end of the channel layer may be connected to a common source line. The channel layer may be surrounded with conductive patterns spaced apart from each other and stacked on the substrate. The conductive patterns may be connected to gates of memory cells. The conductive patterns may extend along the first direction I from an upper portion of the cell area CA to an upper portion of contact areas CTA1 and CTA2. The conductive patterns may form a step structure in the upper portion of the contact areas CTA1 and CTA2.

The memory string formed on the cell area CA may be formed in various structures. For example, the memory string may be formed as a U type or a W type. The structure of the memory string will be described below in more detail with reference to FIG. 2, Ends of the conductive patterns may extend from the cell area CA and be disposed on the contact areas CTA1 and CTA2. The contact areas may include a first contact area CTA1 and a second contact area CTA2 with the cell area CA interposed therebetween.

Figure 2:
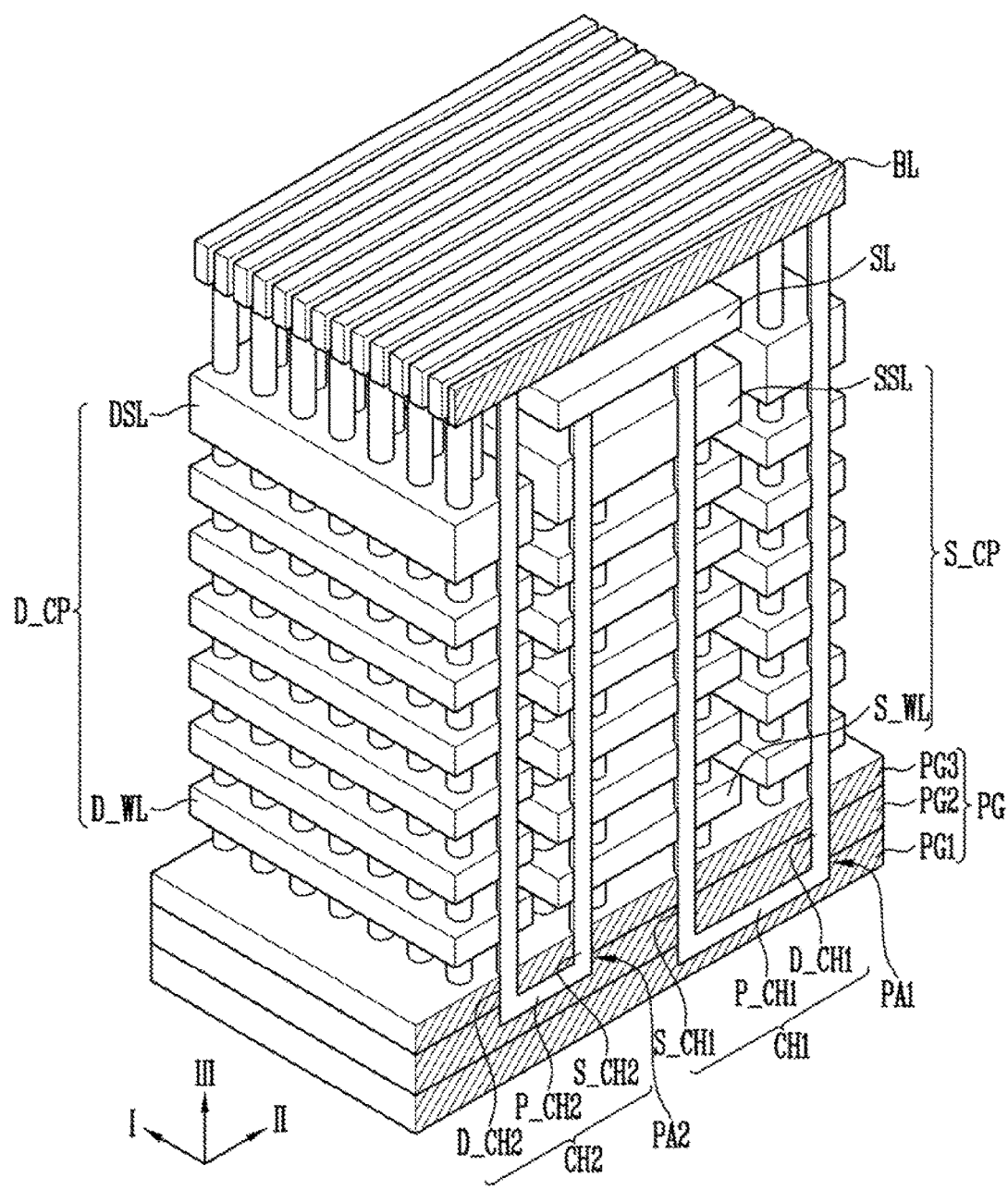
FIG. 2 illustrates a perspective view of a cell array of a memory device according to an embodiment of the present disclosure.

FIG. 2 illustrates a perspective view of a cell array of a memory device according to an embodiment of the present disclosure. For the convenience of description, a plurality of insulating layers including a tunnel insulating layers a data storage layer, a blocking insulating layer, and interlayer insulating layers are not shown in FIG. 2.

Referring to FIG. 2, the cell array according to the embodiment of the present disclosure may include the memory cells stacked along an extending direction of each of channel layers CH1 and CH2, The channel layers CH1 and CH2 may include a lower channel layer CH1 and an upper channel layer CH2

The lower layer channel CH1 may include a lower pipe channel layer P_CH1 and at least a pair of lower channel pillars S_CH1 and D_CH1 extending from the lower pipe channel layer P_CH1. The lower channel pillars may include a source side lower channel pillar S_CH1 and a drain side lower channel pillar D_CH1 extending from both ends of the lower pipe channel layer P_CH1.

The upper layer channel CH2 may include an upper pipe channel layer P_CH2 and at least a pair of upper channel pillars S_CH2 and D_CH2 extending from the upper pipe channel layer P_CH2. The upper channel pillars may include a source side upper channel pillar S_CH2 and a drain side upper channel pillar D_CH2 extending from both ends of the upper pipe channel layer P_CH2.

Each of the lower channel layer CH1 and the upper channel layer CH2 may be formed as a tubular-type semiconductor layer surrounding a central area of a hole filled with an insulating material. Each of the lower channel layer CH1 and the upper channel layer CH2 may be formed as a buried-type semiconductor layer completely filling from a surface to a central area of a hole. The hole may define an area on which the lower channel layer CH1 or the upper channel layer CH2 is arranged. Each of the lower channel layer CH1 and the upper channel layer CH2 may be formed in a structure mixed with the buried-type and the tubular-type semiconductor layers. Although not shown in the drawings, an outer wall of each of the lower channel layer CH1 and the upper channel layer CH2 may be surrounded by three layers or more including a tunnel insulating layer, a memory layer, and a charge blocking layer.

The lower pipe channel layer P_CH1 and the upper pipe channel layer P_CH2 may be surrounded by a pipe gate PG. The pipe gate PG may be formed of a stacked structure including a first pipe conductive layer PG1, a second pipe conductive layer PG2 and a third pipe conductive layer PG3.

The lower pipe channel layer P_CH1 and the upper pipe channel layer P_CH2 may be arranged inside the pipe gate PG. More specifically, the lower pipe channel layer P_CH1 may be disposed inside the first pipe conductive layer PG1. The lower pipe channel layer P_CH1 may be disposed to fill a lower pipe groove PA1 formed inside the first pipe conductive layer PG1. The lower pipe channel layer P_CH1 may be covered with a second pipe conductive layer PG2 disposed on the first pipe conductive layer PG1. The upper pipe channel layer P_CH2 may be disposed inside the second pipe conductive layer PG2. The upper pipe channel layer P_CH2 may be disposed to fill an upper pipe groove PA2 formed inside the second pipe conductive layer PG2. The upper pipe channel layer P_CH2 may be covered with a third pipe conductive layer PG3 disposed on the second pipe conductive layer PG2.

The second pipe conductive layer PG2 and the third pipe conductive layer PG3 may be penetrated by the source side lower channel pillar S_CH1 and the drain side lower channel pillar D_CHL The third pipe conductive layer PG3 may be penetrated by the source side upper channel pillar S_CH2 and the drain side upper channel pillar D_CH2.

According to the above structure, the lower pipe groove PA1 and the lower pipe channel layer P_CH may be arranged at a lower height than the upper pipe groove PA2 and the upper pipe channel layer P_CH2. In addition, the lower pipe groove PA1 and the lower pipe layer channel P_CH1 may be spaced apart from the upper pipe groove PA2 and the upper pipe thannel layer P_CH2.

The upper pipe channel layer P_CH2 may be formed shorter than the lower pipe channel layer P_CH1 and placed at a position higher than the lower pipe channel layer P_CH1. The upper pipe channel layer P_CH2 and the lower pipe channel layer P_CH1 that are formed in a different horizontal length at different heights according to an embodiment of the present disclosure may be more densely arranged than the pipe channel layers formed with the same horizontal length at the same height. Accordingly, the embodiment of the present disclosure may improve the degree of integration of the memory device.

The pipe gate PG may extend along a first direction I and a second direction H crossing each other. Each of the source side lower channel pillar S_CH1, the drain side lower channel pillar D_CH1, the source side upper channel pillar S_CH2, and the drain side upper channel pillar D_CH2 may extend along a third direction ITT perpendicular to a surface of the pipe gate PG, A top end of the source side lower channel pillar S_CH1 and a top end of the source side upper channel pillar S_CH2 may be connected to the common source line SL. A top end of the drain side lower channel pillar D_CH1 and a top end of the drain side upper channel pillar D_CH2 may be connected to the bit line BL corresponding thereto, respectively.

The bit line BL and the common source line SL may be disposed on an upper portion of the structure including the pipe gate P. The bit lines BL may be placed on a different layer from the common source line SL. For example, the bit line BL may be placed at a position higher than the common source line SL. The common source line SL may extend in the first direction I, and the bit line BL may be extend along the second direction II.

Conductive patterns S_CP and D_CP may be stacked and to spaced apart along the third direction III between the pipe gate PG and one of the common source line SL and the bit line BL. The conductive patterns S_CP and D_CP may be separated into drain side conductive patterns D_CP and source side conductive patterns S_CP by the slit. The drain side conductive patterns D_CP and the source side conductive patterns S_CP may extend along the first direction I.

The source side lower channel pillar S_CH1 and the source side upper channel pillar S_CH2 may pass through the source side conductive patterns S_CP. The source side conductive patterns S_CP may be arranged between the pipe gate PG and the common source line SL, stacked and spaced apart along the third direction III. The source side conductive patterns S_CP may include source side word lines S_WL, and at least one layer of a source select line SSL stacked on an upper portion of the source side word lines S_WL.

The drain side lower channel pillar D_CH1 and the drain side upper channel pillar D_CH2 may pass through drain side conductive patterns D_CP. The drain side conductive patterns D_CP may be arranged between the pipe gate PG and the bit line BL, stacked and spaced apart along the third direction HI. The drain side conductive patterns D_CP may include drain side word lines D_WL, and at least one layer of a drain select line DSL stacked on an upper portion of the drain side word lines D_WL. The drain select line DSL may be spaced apart from the drain side word lines D_WL.

According to the above described structure, a pipe transistor may be formed at intersections of the pipe gate PG and the lower channel layer CH1 or at intersections of the pipe gate PG and the upper channel layer CH2. The memory cells may be formed at intersections of word lines D_WL and S_WL and the lower channel layer CH1, and at intersections of the word lines D_WL and S_WL and the upper channel layer CH2, Source select transistors may be formed at an intersection of the source select line SSL and the lower channel layer CH1 and at an in tersection of the source select line SSL and the upper channel layer CH2. Drain select transistors may be formed at intersections of the drain select line DSL and the lower channel layer CH1 and at intersections of the drain select line DSL and the upper channel layer CH2. Thus, a first memory string including the drain select transistor, the memory cells, the pipe transistor and the source select transistor connected in series by the lower channel layer CH1 may be connected between the bit line BL corresponding thereto and the common source line SL. Further, a second memory string including the drain select transistor, the memory cells, the pipe transistor and the source select transistor connected in series by the upper channel layer CH2 may be connected between the bit line BL corresponding thereto and the common source line SL. The first memory string and the second memory string may be densely arranged by densely arranging the lower pipe channel layer P_CH1 and the upper pipe channel layer P_CH2, such that the embodiment of the present disclosure may improve the degree of integration of the memory device in a limited space.

Figure 3A:
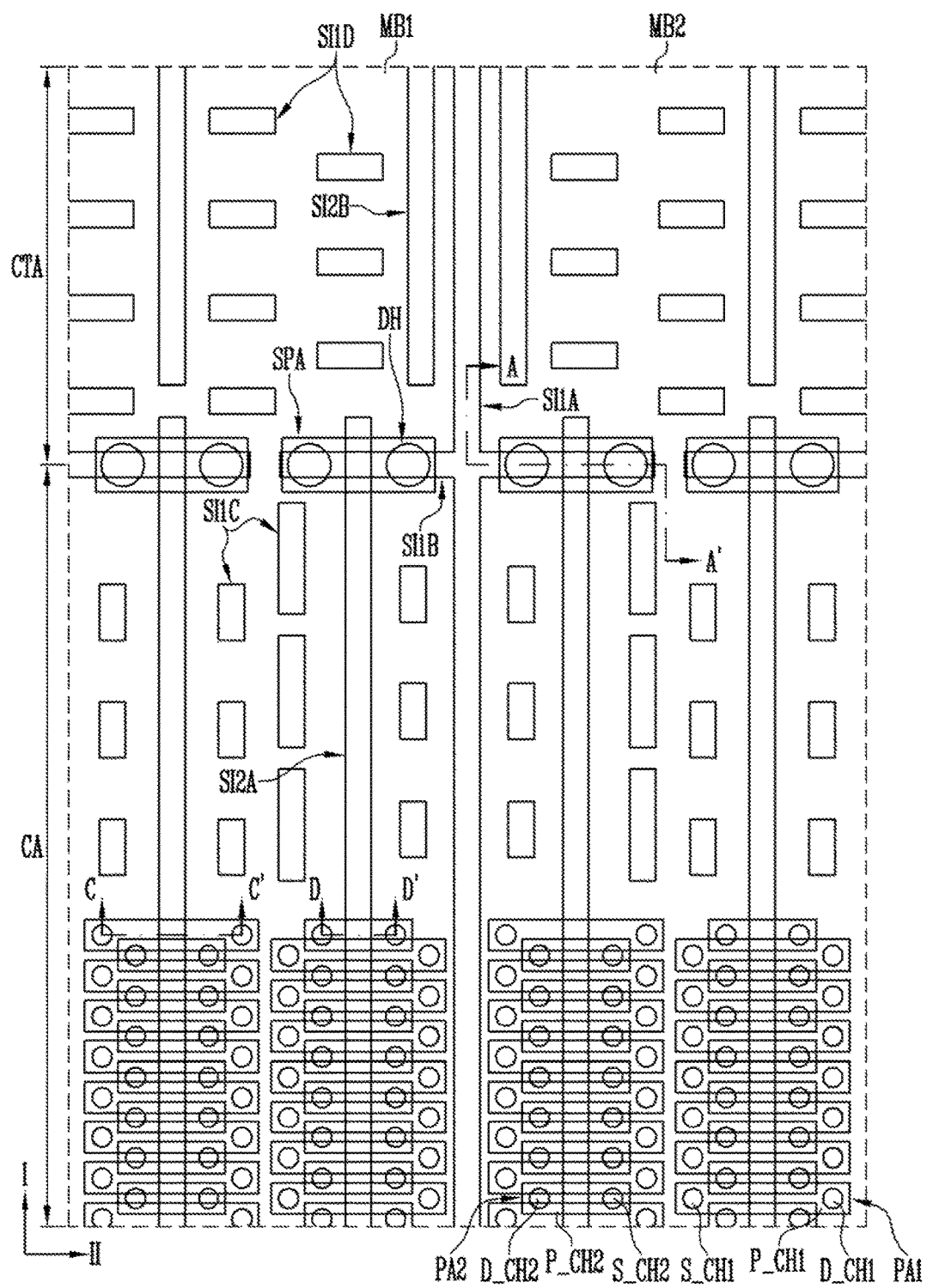
FIG. 3A illustrates a plane view of a layout of a memory device according to an embodiment of the present disclosure.

FIG. 3A illustrates a plane view of a layout of a memory device, according to an embodiment of the present disclosure. FIG. 3A primarily illustrates a cell area CA and a contact area CTA connected to one end of the cell area CA.

Referring to FIG. 3A, the memory device comprises memory block stack bodies MB1 and MB2. Each of the memory bl ock stack bodies MB1 and MB2 includes the cell area CA and the contact area CTA. The contact area CTA may extend in a first direction I from at least one side of the cell rea CA.

Each of the memory block stack bodies MB1 and MB2 may comprise interlayer insulating layers and conductive patterns alternately arranged in an upper portion of a pipe gate (not shown). A stacked structure of the interlayer insulating layers and the conductive patterns will be described below with reference to FIGS. 3B and 3C. The memory block stack bodies MB1 and MB2 may be formed as a step structure in the contact area CTA.

Each of the memory block stack bodies MB1 and MB2 may be penetrated by a source side lower channel pillar S_CH1, a drain side lower channel pillar D_CH1, a source side upper channel pillar S_CH2, and a drain side upper channel pillar D_CH2 disposed in the cell area CA. The source side lower channel pillar S_CH1 and the drain side lower channel pillar D_CH1 may extend from a lower pipe channel layer P_CH1. The lower pipe channel layer P_CH1 may be disposed inside a lower pipe groove PA1 in the pipe gate (not shown) disposed below the memory block stack bodies MB1 and MB2. The source side upper channel pillar S_CH2 and the drain side upper channel pillar D_CH2 may extend from an upper pipe channel layer P_CH2. The upper pipe channel layer P_CH2 may be disposed inside an upper pipe groove PA2 in the pipe gate (not shown) disposed below the memory block stack bodies MB1 and MB2.

The upper pipe channel layer P_CH2 and the lower pipe channel layer P_CH1 may be alternately arranged along the first direction I and a second direction II crossing each other. Each of the upper pipe channel layer P_CH2 and the lower pipe channel layer P_CH1 may be formed in a bar type extending along the second direction II. The lower pipe channel layer P_CH1 may be elongated in the second direction II and longer than the upper pipe channel layer P_CH2. Both ends of the lower pipe channel layer P_CH1 may extend along the second direction II so as not to overlap the upper pipe channel layer P_CH2. The source side lower channel pillar S_CH1 and the drain side lower channel pillar D_CH1 may be arranged adjacent to each other in the second direction II. The source side lower channel pillar S_CH1 and the drain side lower channel pillar D_CH1 may extend from both ends of the lower pipe channel layer P_CH1 that does not overlay the upper pipe channel layer P_CH2. The source side upper channel pillar S_CH2 and the drain side upper channel pillar D_CH2 may be arranged to be adjacent to each other in the second direction II. The source side upper channel pillar S_CH2 and the drain side upper channel pillar D_CH2 may be disposed with a gap narrower than a gap between the source side lower channel pillar S_CH1 and the drain side lower channel pillar D_CH1. For a dense arrangement, the upper pipe channel layer P_CH2 and the lower pipe channel layer P_CH1 adjacent to each other along the first direction I may partially overlap with each other.

The memory block stacked bodies MB1 and MB2 may be penetrated by first slits SI1A, SI1B, SI1C and SI1D and second slits SI2A and SI2B.

The first slits may include a first sub pattern SI1A second sub patterns SI1B, third sub patterns SI1C, and fourth sub patterns SI1D. The first sub pattern SI1A may be disposed between the memory block stacked bodies MB1 and MB2 and extend along the first direction I. The second sub patterns SI1B may be arranged spaced apart along a boundary between the contact area CTA and the cell area CA, and extend along the second direction II, respectively. A portion of the second sub patterns SI1B may be connected to the first sub pattern SI1A. The third sub patterns SI1C may be spaced apart from each other in the cell areas CA. The third sub patterns SI1C may be spaced apart from one side of the cell areas CA adjacent to the contact area CTA. The fourth sub patterns SI1D may be spaced apart from each other in the contact area CTA.

The second slits SI2A and SI2B may extend along the first direction I. The second slits may include cell area patterns SI2A and contact area patterns SI2B. The cell area patterns SI2A may be disposed between the source side lower channel pillar S_CH1 and the drain side lower channel pillar D_CH1 and between the source side upper channel pillar S_CH2 and the drain side upper channel pillar D_CH2. Preferably, the cell area patterns SI2A may be disposed between the source side upper channel pillar S_CH2 and the drain side upper channel pillar D_CH2. The cell area patterns SI2A may extend towards the second sub patterns SI1B of the first slit to intersect the second sub patterns SI1B. Due to the above, an overlapping area in which the cell area patterns SI2A overlap the second sub patterns SI1B may be defined. The cell area patterns SI2A may separate each of the memory block stacked bodies MB1 and MB2 into a source side stacked body and a drain side stacked body. The source side stacked body may be a pattern surrounding the source side lower channel pillar S_CH1 and the source side upper channel pillar S_CH2 adjacent to each other. The drain side stacked body may be a pattern surrounding the drain side lower channel pillar D_CH1 and the drain side upper channel pillar D_CH2 adjacent to each other. The contact area pattern SI2B may pass through the memory block MB1 and MB2 in the contact area CTA.

An etch stop pad groove SPA may overlap at an intersection of the second sub pattern SI1B of the first slit and the cell area pattern SI2A of the second slit. The pad etch stop groove SPA may be disposed in the pipe gate and extend along the second sub pattern SI1B of the first slit. The second sub pattern SI1B may be directly connected to the etch stop pad groove SPA. Alternatively, the second sub pattern SI1B may be connected to the pad etch stop groove SPA through at least one dummy hole DH penetrating a portion of the pipe gate between the second sub pattern SI1B and the etch stop pad groove SPA.

The etch stop pad groove SPA and the dummy hole DH may be formed as various shapes. For example, the etch stop pad groove SPA and the dummy hole DH may be formed as a rectangular type, a square type, an oval type, or a circular type.

The etch stop pad groove SPA may be disposed at the same height as the upper pipe groove PA2. The lower pipe groove PA1 may be placed at a height lower than the etch stop pad groove SPA and the upper pipe groove PA2. A vertical placement of the etch stop pad groove SPA, the upper pipe groove PA2, and the lower pipe groove PA1 may be shown in FIGS. 3B and 3C.

Figure 3B:
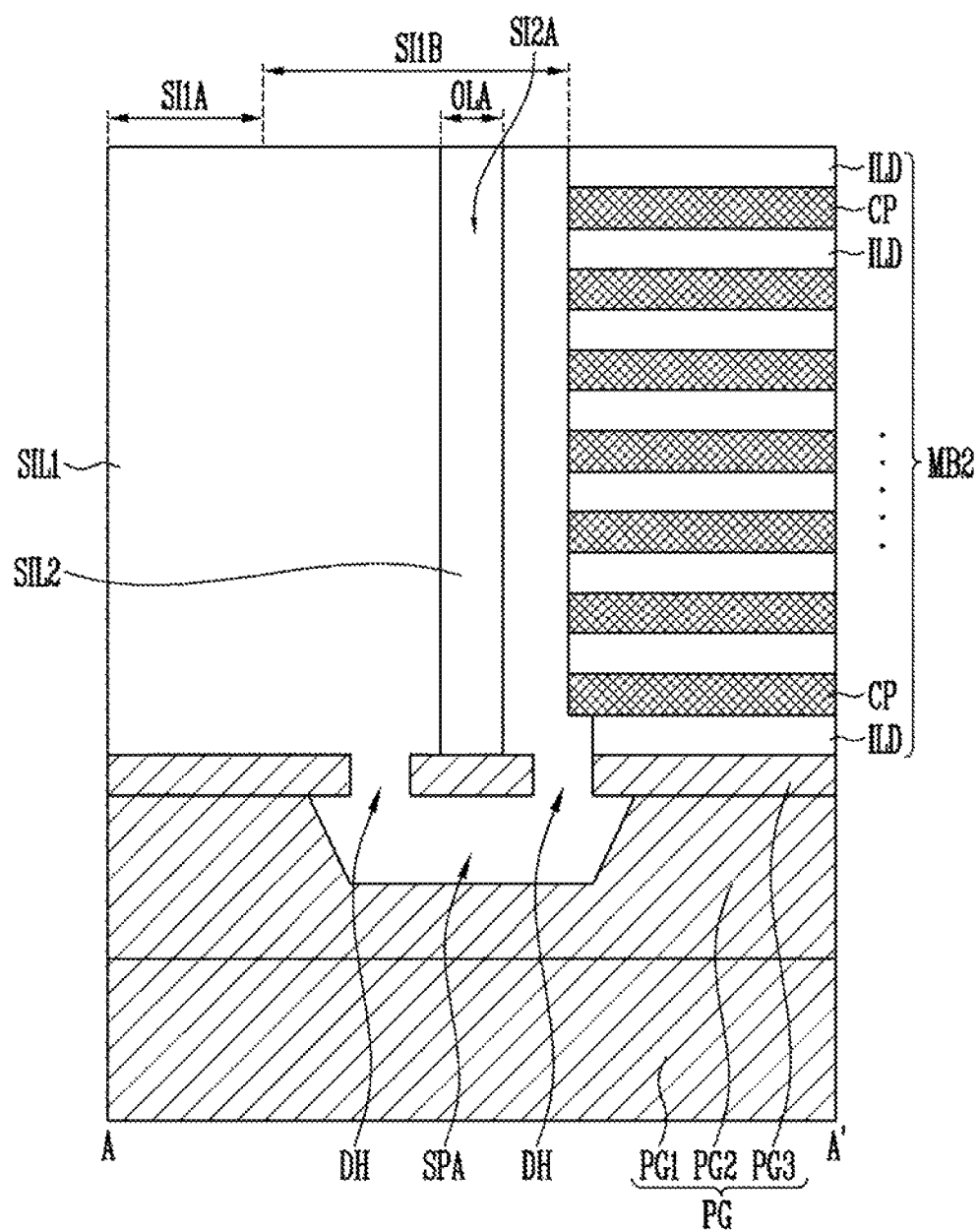
FIGS. 3B and 3C illustrate cross sectional views of various structures taken along line A-A' shown in FIG. 3A.
Figure 3C:
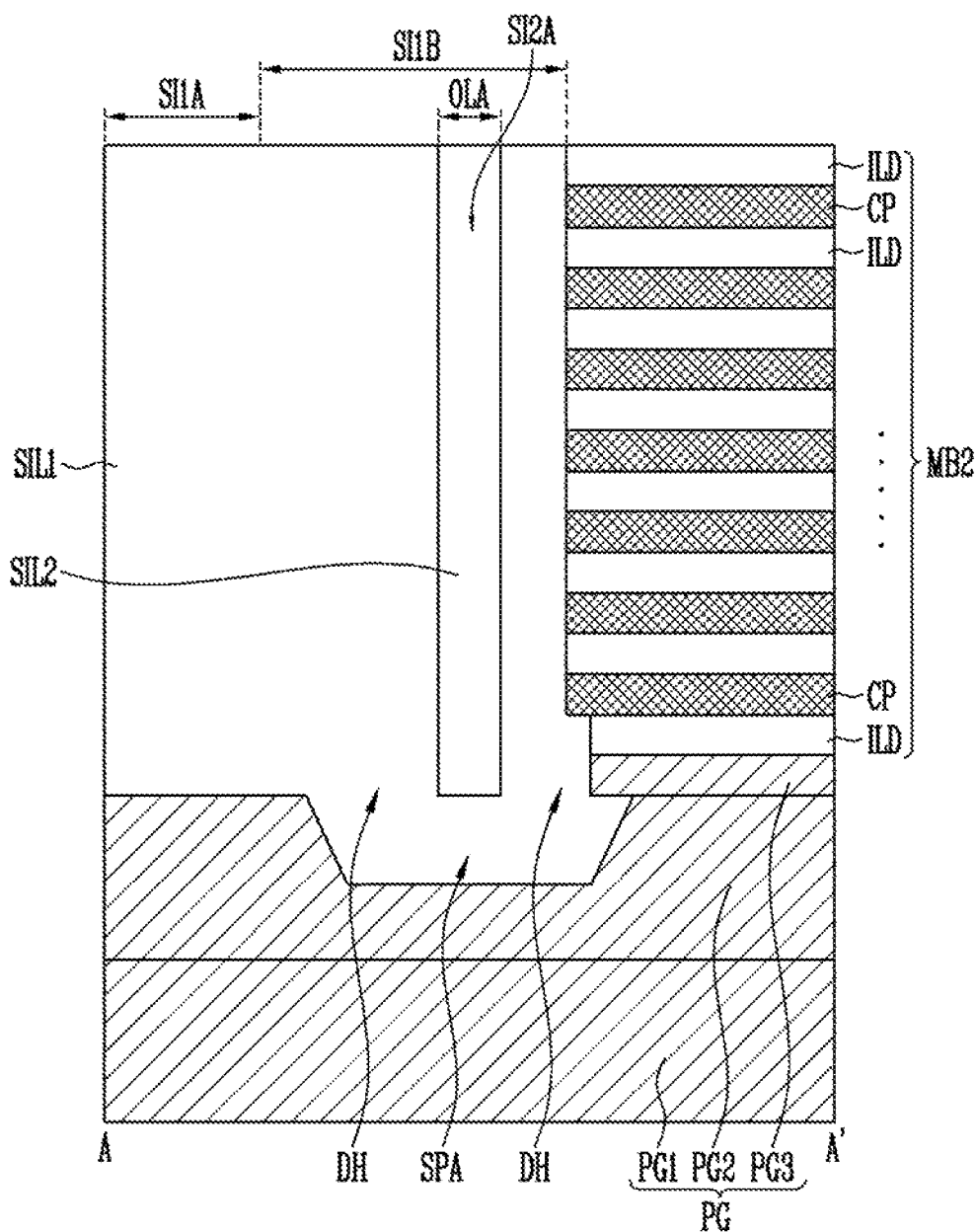

FIGS. 3B and 3C illustrate cross sectional views of various structures taken along line A-A' shown in FIG. 3A. FIG. 3B is a cross sectional view illustrating the first slits and the second slits spaced apart from the etch stop pad groove. FIG. 3C is a cross sectional view illustrating the first slits and the second slits directly connected to the etch stop pad groove.

Referring to FIGS. 3B and 3C, the memory block stacked body MB2 may include interlayer insulating layers ILD and conductive patterns CP alternately stacked on the pipe gate PG.

The pipe gate PG may be formed of a stacked structure of first to third pipe conductive layers PG1 to PG3 as described above in FIG. 2. The etch stop pad groove SPA may be disposed inside the second pipe conductive layer PG2.

The inter layer insulating layers ILD and the conductive patterns CP may be penetrated by the first slits SI1A and SI1B and the second slit SI2A. The first slits SI1A and SI1B described In the drawing may be the first sub pattern SI1A and the second sub pattern SI1B. The second slit SI2A described in the drawing may be the cell area pattern SI2A intersecting the second sub pattern SI1B of the first slits SI1A and SI1B. Hereinafter, an area in which the second sub pattern SI1B overlaps the cell area patterns SI2A will be referred to as a slit overlapping area OLA.

The etch stop pad groove SPA may be disposed to overlap the slit overlapping area OLA. The etch stop pad groove SPA may be connected to the first slits SI1A and SI1B. More specifically, the etch stop pad groove SPA may be connected to at least one of the first sub pattern SI1A and the second sub pattern SI1B.

As shown in FIG. 3B, the first slits SI1A and SI1B may extend to an upper surface of the third pipe conductive layer PG3. In this case, the third pipe conductive layer PG3 between the second sub pattern SI1B of the first slits and the etch stop pad groove SPA may be penetrated by the dummy holes DH. The dummy holes DH may be disposed between the etch stop pad groove SPA and the second sub pattern SI1B. The etch stop pad groove SPA may be connected to the first slits SI1A and SI1B through the dummy holes DH.

Alternatively, as shown in FIG. 3C, the first slits SI1A and SI1B may extend to an upper surface of the second pipe conductive layer PG2 and be directly connected to the etch stop pad groove SPA. The first slits SI1A and SI1B may extend to a bottom surface of the dummy holes DH passing through the third pipe gate PG3 between the second sub pattern SI1B of the first slits and the etch stop pad groove SPA.

Referring to FIGS. 3B and 3C the first slits SI1A and SI1B, the etch stop pad groove SPA, the dummy holes DH, and the cell area pattern SI2A may be filled with slit insulating layers SIL1 and SIL2. The slit insulating layer may include a first slit insulating layer SIL1 and a second slit insulating layer SIL2.

The first insulating layer slit SIL1 may fill the first slits SI1A and SI1B, the etch stop pad groove SPA, and the dummy holes SPA. The second slit insulating layer SIL2 may fill the cell area pattern SI2A. In particular, the second slit insulating layer SIL2 may be formed inside the first siitinsulating layer SIL1 in the slit overlapping area OLA. Depths of the cell area pattern SI2A and the second slit insulating layer SIL2 may be equal to depths of the first slits SI1A and SI1B.

Figure 4A:
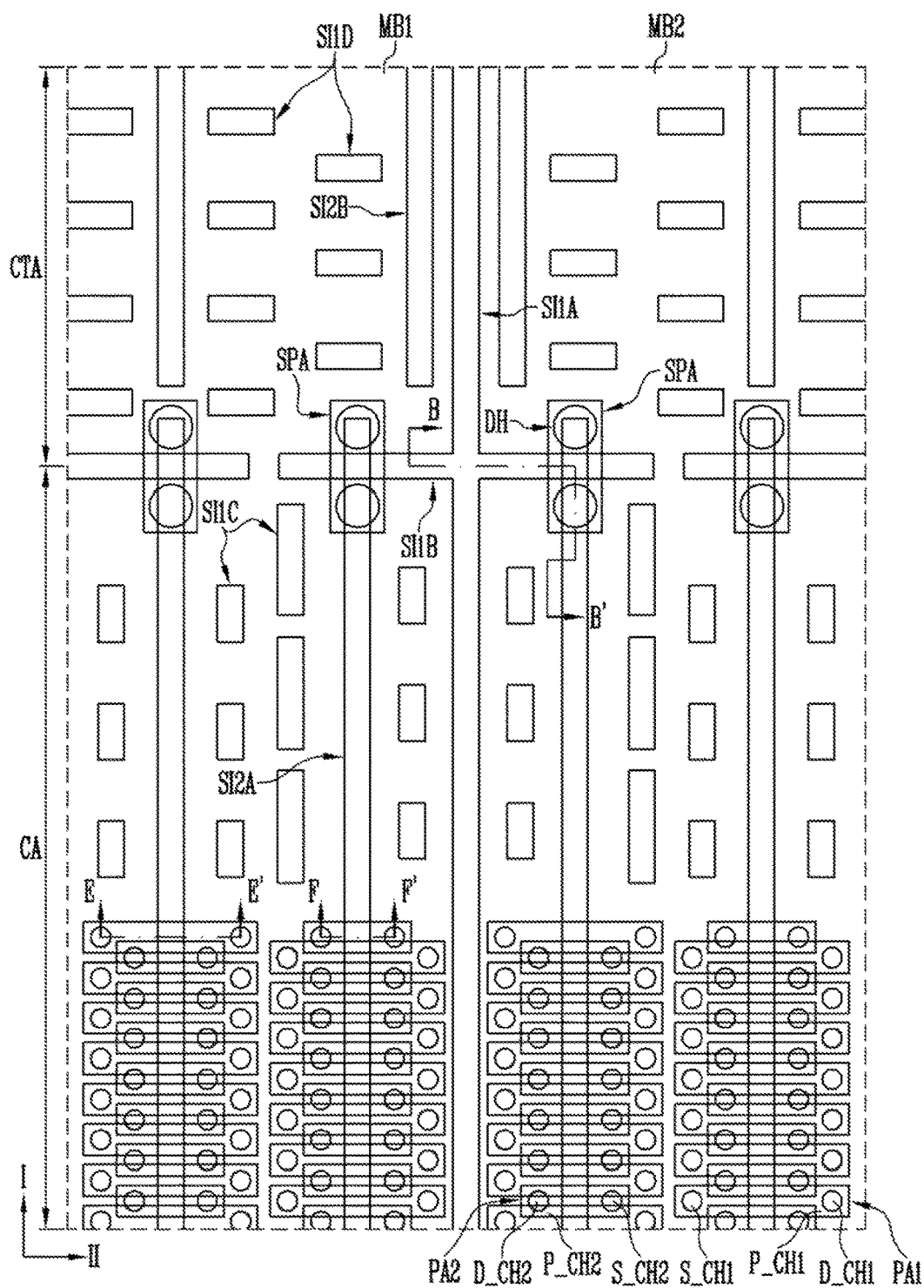
FIG. 4A illustrates a plane view of a layout of a memory device according to an embodiment of the present disclosure.

FIG. 4A illustrates a plane view illustrating a layout of a memory device according to an embodiment of the present disclosure. FIG. 4A mainly illustrates a cell area CA and a contact area CTA connected to one end of the cell area CA. FIG. 4A is an example of modifying a layout of the etch stop pad groove and the dummy holes illustrated in FIG. 3A. In FIGS. 3A and 4A, like reference numerals are used to refer: to the same elements, Referring to FIG. 4A, the memory device may Include the memory block stacked bodies MB1 and MB2. Each of the memory block stacked bodies MB1 and MB2 includes the cell area CA and the contact area CTA. The contact area CTA may extend from at least one end of the cell area CA in a first direction I The memory block stacked bodies MB1 and MB2 may be formed in the same layout as described above in FIG. 3A.

Each of the memory block stacked bodies MB1 and MB2 may be penetrated by a source side lower channel pillar S_CH1, a drain side lower channel pillar D_CH1, a source side upper channel pillar S_CH2 and a drain side upper channelpillar D_CH2 disposed in the cell area CA. The source side lower channel pillar S_CH1 and the drain side lower channel pillar D_CH1 may extend from a lower pipe channel layer P_CH1 disposed inside a lower pipe groove PA1 in a pipe gate (not shown) disposed below the memory block stack bodies MB1 and MB2. The source side upper channel pillar S_CH2 and the drain side upper channel pillar D_CH2 may extend from an upper pipe channel layer P_CH2 disposed inside an upper pipe groove PA2 in the pipe gate (not shown) disposed below the memory block stack bodies MB1 and MB2. The source side lower channel pillar S_CH1, the drain side lower channel pillar the source side upper channel pillar S_CH2, the drain side upper channel pillar D_CH2, the lower pipe channel layer P_CH1 and the upper pipe channel layer P_CH2 may be formed in the same layout as described in FIG. 3.

The memory block stacked bodies MB1 and MB2 may be penetrated by first slits SI1A, SI1B, SI1C and SI1D and second slits SI2A and SI2B. The first slit may include a first sub pattern to a fourth sub pattern SI1A, SI1B, SI1C and SI1D arranged in the same Payout described FIG. 3A. The second slits may include cell area patterns SI2A and contact area patterns SI2B arranged in the same layout described FIG. 3A.

An etch stop pad groove SPA may overlap at an intersection of the second sub pattern SI1B of the first slit and the cell area pattern SI2A of the second slit. The etch stop pad groove SPA may be disposed inside the pipe gate and extend along the cell area pattern SI2A of the second slit. The cell area pattern SI2A may be directly connected to the etch stop pad groove SPA. Alternatively, the cell area pattern SI2A may be connected to the etch stop pad groove SPA through at least one dummy hole DH penetrating a portion of the pipe gate between the cell area pattern SI2A and the etch stop pad groove SPA.

Figure 4B:
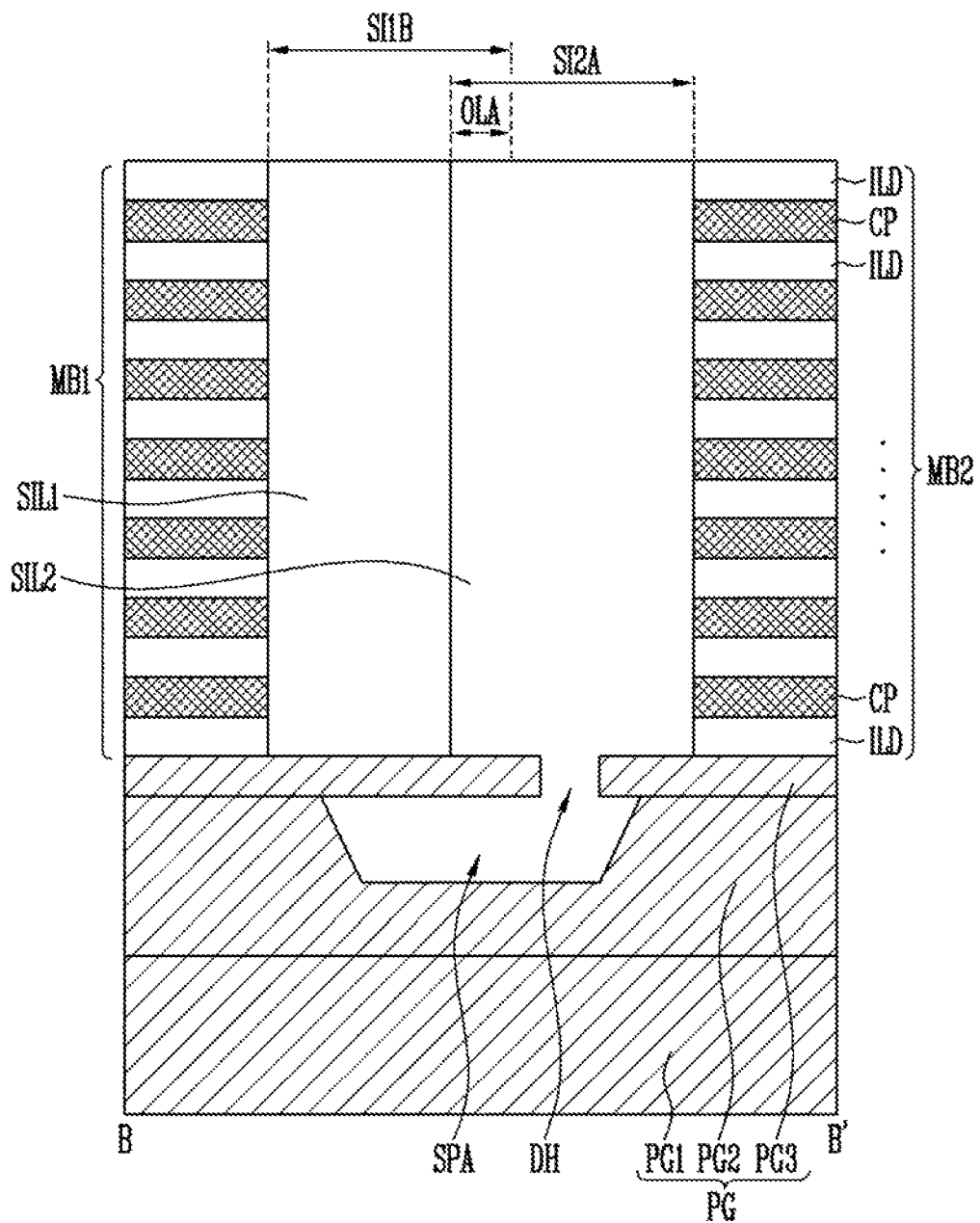
FIGS. 4B and 4C illustrate cross sectional views of various structures taken along line B-B' shown in FIG. 4A.
Figure 4C:
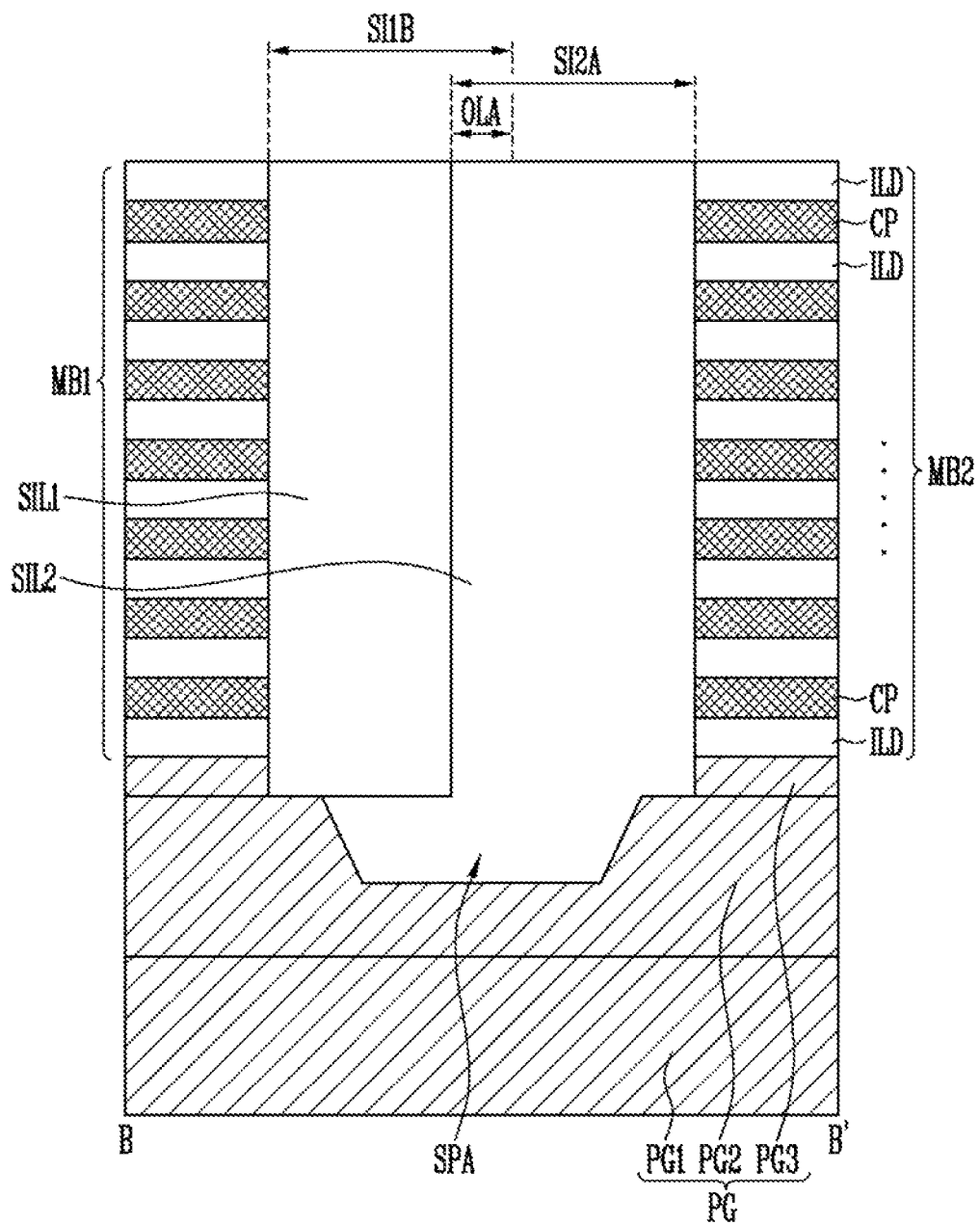

FIGS. 4B and 4C cross sectional views illustrating various structures aken ilong line B-B' shown in FIG. 4A.

FIG, 4B is a cross sectional view illustrating an example of the first slits and the second slits spaced apart from the etch stop pad groove. FIG. 4c is a cross sectional view illustrating an example of the first slit and the second directly connected to the etch stop pad groove.

Referring to FIGS. 48 and 4C, the memory block stacked bodies M81 and M82 may include interlayer insulating layers ILD and conductive patterns CP alternately stacked over the pipe gate PG.

The pipe gate PG may be formed of a stacked structure of first to third pipe conductive layers PG1 to PG3 as described above in FIG. 2. The etch stop pad groove SPA may be disposed inside the second pipe conductive layer PG2.

The inter layer insulating layers ILD and the conductive patterns CP may be penetrated by the first slit SI1B and the second silt SI2A. The first slit S118 shown in the drawing may be the second sub pattern SI1B. The second slit SI2A shown in the drawing may be the cell area pattern SI2A crossing the second sub pattern SI1B. Hereinafter, an area in which the second sub pattern SI1B overlaps the cell area pattern SI2A will be referred to as a slit overlapping area OLA.

The etch stop pad groove SPA may be disposed to overlap the slit overlapping area OLA, The etch stop pad groove SPA may be connected to the cell area pattern SI2A.

As shown in FIG. 4B, the cell area pattern. SI2A may extend to an upper surface of the third pipe conductive layer PG3. In this case, the third pipe conductive layer PG3 between the cell area pattern SI2A of the second slit and the etch stop pad groove SPA may be penetrated by the dummy hole DH. The dummy holes DH may be disposed between the cell area pattern SI2A and the etch stop pad groove SPA. The etch stop pad groove SPA may be connected to the cell area pattern SI2A through the dummy hole DH. The first slits including the second sub pattern SI1B may extend to the upper surface of the third pipe conductive layer PG3.

As shown in FIG. 4C, the cell area pattern SI2A of the second slit may extend to an upper surface of the second pipe conductive layer PG2 and be directly connected to the etch stop pad groove SPA. In this case, the cell area pattern SI2A may extend to a bottom surface of the dummy holes DH penetrating the third pipe gate PG3 between the cell area pattern SI2A and the etch stop pad groove SPA. The first slits including the second sub patterns SI1B may extend to the upper surface of the second pipe conductive layer PG2.

Referring to FIGS. 4B and 4C, the second sub pattern SI1B of the first slit, the etch stop pad groove SPA, the dummy hole DH, and the cell area pattern SI2A of the second slit may be filled with slit insulating layers SIL1 and SIL2. The slit insulating layers may include a first slit insulating layer SIL1 and a second slit insulating layer SIL2.

The first slit insulating layer SIL1 may fill the second sub pattern SI1B. The second slit insulating layer SIL2 may fill the cell area pattern SI2A, the etch stop pad groove SPA and the dummy hole DH. In particular, the second slit insulating layer SIL2 may be formed inside the first slit insulating layer SIL1 in the slit overlapping area OLA. A depth of the first slit including the second sub pattern SI1B and a depth of the first slit insulating layer SIL1 may be equal to a depth of the cell area pattern SI2A.

As described above, in the embodiments of the present disclosure the etch stop pad groove SPA may overlap the slit overlapping area OLA. The etch stop pad groove SPA may be filled with an etch stop pattern during a manufacturing process of a three dimensional semiconductor memory device. Accordingly, the etch stop pattern inside the etch stop pad groove SPA may prevent a conductive layer such as, a pipe gate PG or a substrate in a lower portion of the slit overlapping area OLA from being damaged during the manufacturing process of the first slit or the second slit.

Hereafter, referring to FIGS. 5A to 10C, a method of manufacturing a semiconductor device according to an embodiment of the present disclosure will be described in more detail below.

FIGS. 5A to 8C illustrate cross sectional views for a manufacturing method of a memory device, according to an embodimen t of the present disclosure. FIGS. 5A to 8C are cross sectional views taken along the lines A-A', C-C and D-D' shown in FIG. 3A.

FIGS. 5A to 5C are cross sectional views illustrating a process of forming an etch stop pattern.

Referring to FIG. 5A, a pipe gate PG in which sacrificial layers 107A, 103, and 107B are embedded may be formed. The sacrificial layers 107A, 103, and 107B may include a pad sacrificial layer 107A filling an etch stop pad groove SPA, a lower pipe sacrificial layer 103 filling a lower pipe groove PA1, and an upper pipe sacrificial layer 107B filling an upper pipe groove PA2.

The sacrificial layers 107A, 103, and 107B may be formed of a material different from the pipe gate PG and have an etch selectivity to the pipe gate PG. For example, the sacrificial layers 107A, 103, and 107B may be formed of a nitride layer.

An example of a manufacturing process of the pipe gate PG in which the sacrificial layers 107A, 103 and 107B are embedded will be described in more detail as follows.

First, a first pipe conductive layer 101 may be formed on a substrate (not shown). Thereafter, the first pipe conductive layer 101 may be etched so that the lower pipe groove PA1 is formed therein, The first pipe conductive layer 101 may be formed of a conductive material such as polysilicon. Subsequently, the lower pipe sacrificial layer 103 may fill the first pipe groove PA1 in the first pipe conductive layer 101. To this end, a manufacturing process of forming the a first sacrificial layer that completely fills the first pipe groove PA1 in the first pipe conductive layer 101, and a manufacturing process of planarizing an upper surface of the first sacrificial layer so that an upper surface of the first pipe conductive layer 101 is exposed may be sequentially performed. Before forming the first sacrificial layer, a buffer layer (not shown) may be formed on a surface of the first pipe groove PA1. The buffer layer may be an oxide layer.

Subsequently, a second pipe conductive layer 105 may be formed on the first pipe conductive layer 101 to cover the lower pipe sacrificial layer 103. The second pipe conductive layer 105 may formed of a conductive material such as polysilicon. Thereafter, by partially etching a portion of the second pipe conductive layer 105, the etch stop pad groove SPA and the upper pipe groove PA2 may be simultaneously formed therein. Subsequently, the pad sacrificial layer 107A filling the etch stop pad groove SPA and the upper pipe sacrificial layer 107B filling the upper pipe groove PA2 may be simultaneously formed in the second pipe conductive layer 105. The pad sacrificial layer 107A and the upper pipe sacrificial layer 107B may be formed by sequentially performing a manufacturing process of forming a second sacrificial layer having a thickness that completely fills the etch stop pad groove SPA and the upper pipe groove PA2 in the second pipe conductive layer 105, and a manufacturing process of planarizing ani upper surface of the second sacrificial layer so that an upper surface of the second pipe conductive layer 105 is exposed. The second sacrificial layer may be formed of the same material as the first sacrificia layer. More specifically the second sacrificial layer may be a nitride layer. Before the second sacrificial layer is formed, a buffer layer (not shown) may be further formed on surfaces of the etch stop pad groove SPA and the upper pipe groove PA2. The buffer layer may be an oxide layer.

Subsequently, a third pipe conductive layer 109 may be formed on the second pipe conductive layer 105 so as to cover the pad sacrificial layer 107A and the upper pipe sacrificial layer 107B. The third pipe conductive layer 109 may be formed of a conductive material such as polysilicon.

The pipe gate PG in which the sacrificial layers 107A, 103, and 107B are embedded may be formed through the above described process.

Subsequently, a first interlayer insulating layer 111 may be formed on the pipe gate PG. The first interlayer insulating layer 111 may be the same material as a second material layer formed in sequence, in more detail, the first interlayer insulating layer 111 may be an oxide layer.

Thereafter, holes DH, HA1 and HA2 exposing the sacrificial layers 107A, 103 and 107B may be formed by etching a portion of the first interlayer insulation layer 111 and a portion of the pipe gate PG. The holes may include a dummy hole DH, lower pipe opening holes HA1 and upper pipe opening holes HA2. The dummy hole DH may pass through the third pipe conductive layer 109 to expose an upper surface of the pad sacrificial layer 107A. The lower pipe opening holes HA1 may pass through the third pipe conductive layer 109 and the second pipe conductive layer 105 to expose an upper surface of the lower pipe sacrificial layer 103. The lower pipe sacrificial layer 103 may be exposed by at least one pair of the lower pipe opening holes HA1. The upper pipe opening holes HA2 may pass through the third pipe conductive layer 109 to expose an upper surface of the upper pipe sacrificial layer 107B. The upper pipe sacrificial layer 107B may be exposed by at least one pair of the upper pipe opening holes HA2. The dummy holes DH may be simultaneously formed with the upper pipe opening holes HA2.

Referring to FIG. 5B, the sacrificial layers 107A, 103, and 107B may be removed through the holes DH, HA1, and HA2. Thus, the etch stop pad groove SPA, the lowerpipe groove PA1, and the upper pipe groove PA2 may be opened.

Referring to FIG. 5C, an etch barrier material layer having a thickness that completely fills the etch stop pad groove SPA, the lower pipe groove PA1, the upper pipe groove PA2, the dummy hole DH, the lower pipe opening holes HA1 and the upper pipe opening holes HA1 may be formed on the first interlayer insulating layer 111 and the pipe gate PG. Thereafter, the etch barrier material layer may be planarized until an upper surface of the first interlayer insulating layer 111 is exposed. Thus, an etch stop pattern 113A filling the etch stop pad groove SPA and the dummy hole DH, a lower protective layer 113B filling the lower pipe groove PA1 and the lower pipe opening holes HA1 connected thereto and an upper protective layer 113C filling the upper pipe groove PA2 and the upper pipe opening holes HA2 connected thereto may be simultaneously formed.

Figure 6B:
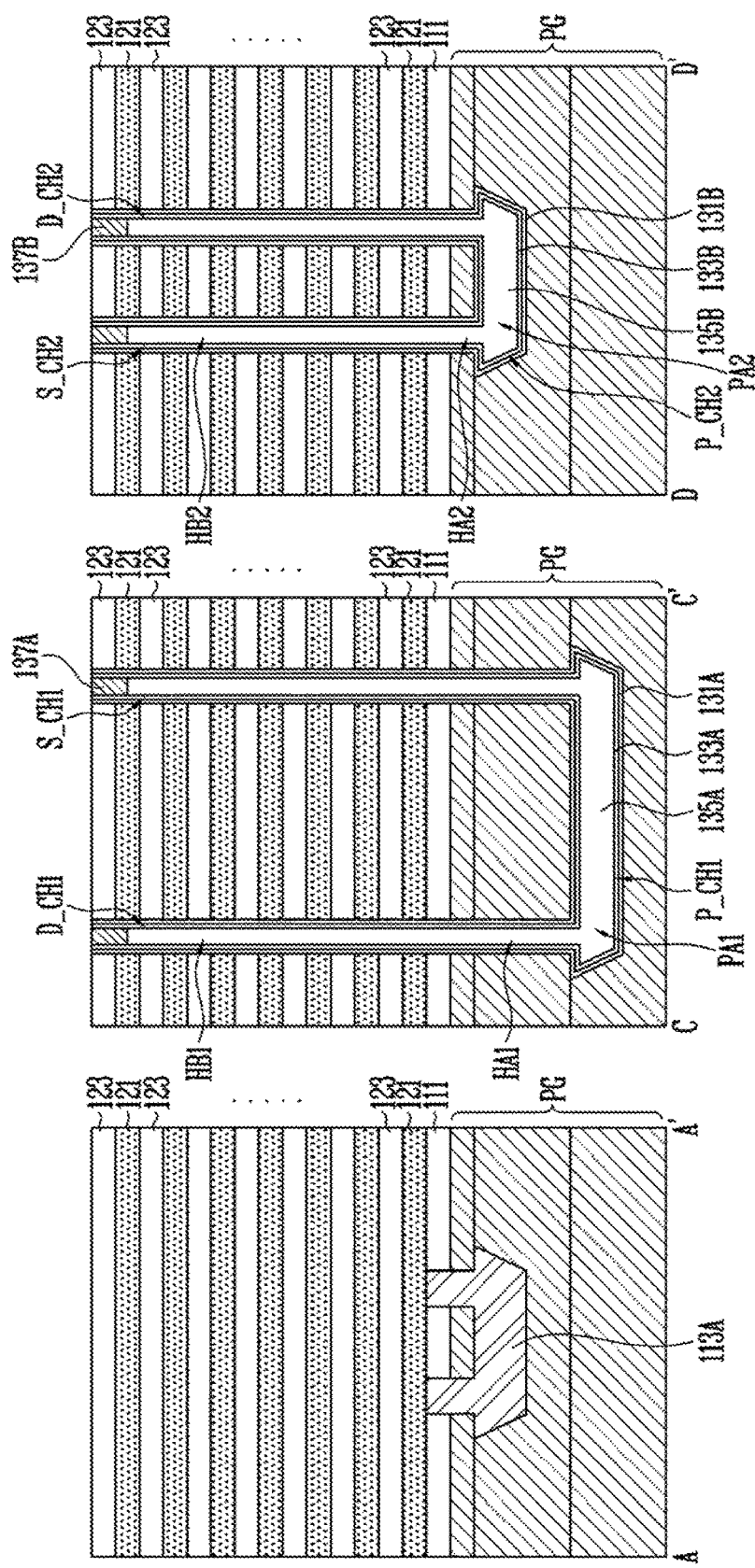

The etch barrier material layer may be formed of a different material from first material layers and second material layers formed in a subsequent process such as, the first material layers 121 and second material layers 123 shown in FIGS. 6A and 6B). More specifically, the etch barrier material layer may be formed of a material having an etch selectivity to the first material layers and the second material layers formed in the subsequent process. For example, the etch barrier material layer may include at least one of titanium nitride, tungsten, tungsten silicide, cobalt silicide, and nickel silicide.

As described in FIGS. 5A to 5C, in the embodiment of the present disclosure, the etch stop pad groove SPA and the upper pipe groove PA2 may be simultaneously formed. The dummy holes DH, the lower pipe opening hole PA1 and the upper pipe opening hole PA2 may be simultaneously formed, and the etch stop pattern 113A, the lower protective layer 113B and the upper protective layer 113C may be simultaneously formed. Thus, according to the embodiments of the present disclosure, a processing cost may be reduced and a process of manufacturing a semiconductor device may be simplified.

FIGS. 6A and 6B are cross sectional views illustrating a forming process of channel layers.

Referring to FIG. 6A, first material layers 121 and second material layers 123 may be alternately stacked on the first interlayer insulating layer 111 to cover the etch stop pattern 113A, the lower protective layer 113B, and the upper protective layer 113C. More specifically, the first material layers 121 may be formed of a material having an etch selectivity to the second material layer 123. The second material layers 123 may be formed of a silicon oxide layer serving as a second interlayer insulating layer. The first material layer 121 may include a nitride layer.

Subsequently, channel holes HB1 and HB2 that expose the lower protective layer 113B and the upper protective layer 113C may be formed by etching the first material layers 121 and the second material layer 123. The channel holes may include first channel holes HB1 and second channel holes HB2. The first channel holes HB1 may pass through the first material layers 121 and the second material layers 123, expose the lower protective layer 113B and are connected to the lower pipe opening holes HA1. The second channel holes HB2 may pass through the first material layers 121 and the second material layers 123, expose the upper protective layer 113C and are connected to the upper pipe opening holes HA2.

Referring to FIG. 6B, the lower protective layer 113B and the upper protective layer 113C may be removed via the channel hole HB1 and HB2. Thus, the lower pipe groove PA1 and the lower pipe opening holes HA1 connected thereto may be opened, and the upper pipe groove PA2 and the upper pipe opening holes HA2 connected thereto may be opened. The lower pipe groove PA1, the lower pipe opening holes HA1, and the first channel holes HB1 connected to one another may define a first string hole structure, and the upper pipe grooves PA2, the upper pipe opening holes HA2, and the second channel holes HB2 connected to one another may define a second string hole structure.

Subsequently, a multilayer may be formed on a surface of the first string hole structure and a surface of the second string hole structure, the multilayer may be planarized. Thus, the multilayer may be separated into a first multilayer pattern 131A within the first string hole structure and a second multilayer pattern 131B within the second string hole structure. Each of the first multilayer pattern 131A and the second multilayer pattern 131B may be formed of a stacked structure of a blocking insulating layer, a data storage layer and a tunnel insulating layer. The blocking insulating layer may be formed of an oxide layer capable of blocking a charge. The data storage layer may be formed of a silicon nitride layer capable of a charge trap, The tunnel insulating layer may be formed of a silicon oxide layer capable of a charge tunneling.

Thereafter, a channel layer may be formed on the first multilayer pattern 131A and the second multilayer pattern 131B. The channel layer ay be formed of a semiconductor layer such as silicon. The channel layer may be formed as a tubular-type along an inner wall of the first string hole structure and the second string hole structure, or as a buried-type completely filling the first string hole structure and the second string hole structure. The channel layer may be planarized. Thus, the channel layer may be separated into a lower channel layer 133A within the first string hole structure and an upper channel layer 133B within the second string hole structure.

The lower channel layer 133A may extend along the first channel holes H81, the lower pipe opening holes HA1, and the lower pipe groove PA1. The lower channel layer 133A may include a lower pipe channel layer P_CH1 and a drain side lower channel pillar D_CH1 and a source side lower channel pillar S_CH1 extended from the lower pipe channel layer P_CH1. The lower pipe channel layer P_CH1 may be disposed inside the lower pipe groove PA1. The drain side lower channel pillar D_CH1 may be disposed inside one of the first channel holes H81 and the lower pipe opening, hole HA1 connected thereto. The source side lower channel pillar S_CH1 may be disposed inside one of the other first channel holes HB1 and the lower pipe opening hole HA1 connected thereto.

The upper channel layer 133B may extend along the second channel holes H82, the upper pipe opening holes HA2, and the upper pipe groove PA2. The upper channel layer 133B may include an upper pipe channel layer P_CH2 and a drain side upper channel pillar D_CH2 and a source side upper channel pillar S_CH2 extended from the upper pipe channel layer P_CH2. The upper pipe channel layer P_CH2 may be disposed inside the upper pipe groove PA2. The drain side upper channel pillar D_CH2 may be disposed inside one of the second channel holes HB2 and the upper pipe opening holes HA2 connected thereto. The source side upper channel pillar S_CH2 may be disposed inside one of the other second channe holes HB2 and the upper pipe opening hole HA2 connected thereto.

When the lower channel layer 133A and the upper channel layer 133B are formed as the tubular-type, a first core insulating layer 135A filling a central area of the lower channel layer 133A and a second core insulting layer 135B filling a central area of the upper channel layer 133B may be further formed. Both ends of the first core insulating, layer 135A and the second core insulting layer 135B may be formed at a lower height than both ends of the lower channel layer 133A and the upper channel layer 133B. In this case, first doped patterns 137A contacted to both ends of the lower channel layer 133A may be formed on the first core insulating layer 135A. In addition, second doped patterns 137B contacting both ends of the upper channel layer 133B may be formed on the second core insulating layer 135B. The first doped patterns 137A and the second doped patterns 137B may be used as a junction and formed in a doped polysilicon.

Figure 7A:
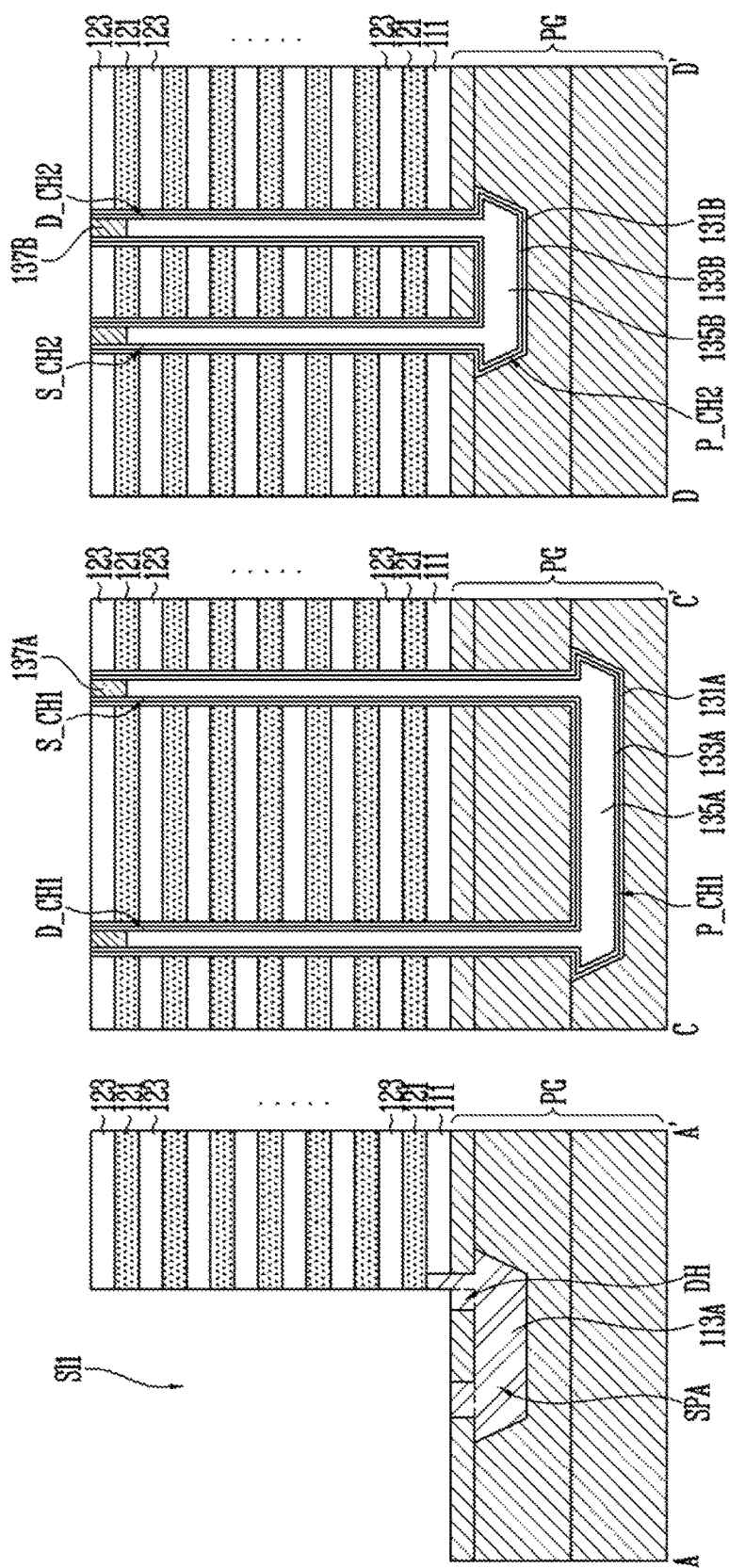
Figure 7B:
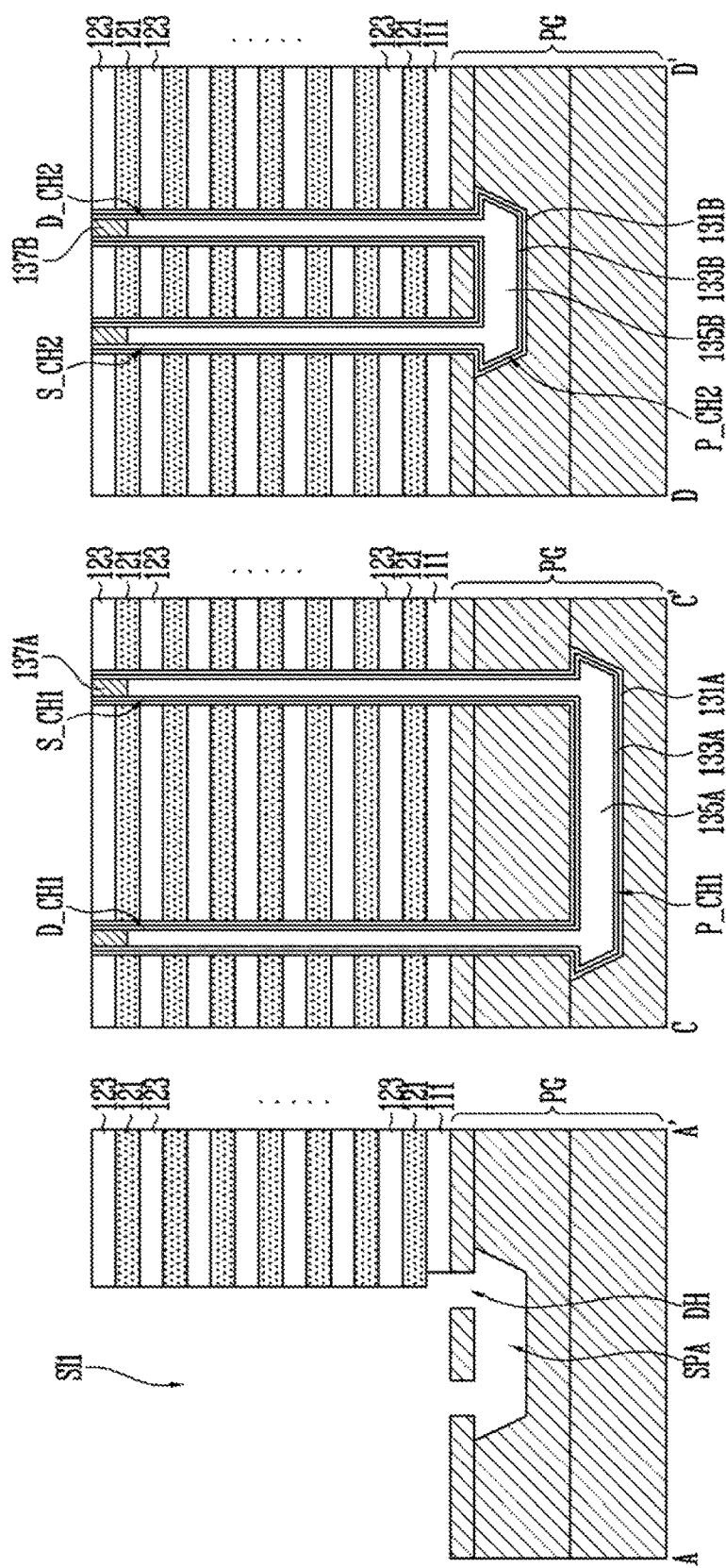

FIGS. 7A to 7C are cross sectional views illustrating a process of forming a first slit insulating layer.

Referring to FIG. 7A, a first slit SI1 may be formed by etching the first material layers 121 and the second material layers 123. The first slit SI1 penetrates the first material layers 121 and the second material layers 123. The first slit SI1 may correspond to the first sub pattern SI1A and the second sub pattern SI1B illustrated in FIG. 3A. At least a portion of the first slit SI1 may overlap the etch stop pattern 113A.

The first slit SI1 may extend to an upper surface of the pipe gate PG and be connected to the dummy hole DH, which corresponds to FIG. 3B. Alternatively, as indicated by a broken line, the first slit SI1 may extend to a bottom surface of the dummy hole DH to connect to the etch stop pad groove SPA which corresponds to FIG. 3C.

The etch stop pattern 113A may be formed of a material having an etch selectivity to the first material layers 121 and the second material layers 123. In particular, the first etch stop pattern 113A may be formed of a material having a higher etch selectivity to the first material layers 121 and the second material layers 123, than the pipe gate PG. For example, the first etch stop pattern 113A may be formed of TiN. Accordingly, during forming the first slits SI1, a bottom surface of the first slit SI1 may be arranged on an upper surface of the etch stop pad groove SPA filled with the etch stop pattern 113A.

Referring to FIG. 7B, the pad etch stop groove SPA and the dummy hole DH may be opened by removing the etch stop pattern 113A through the first slit SI1.

Referring to FIG. 7C, a first slit insulating layer 141 is formed such that the first slit insulating layer 141 fills the first slit SI1, the etch stop pad groove SPA and the dummy hole DH. When the bottom surface of the first slit SI1 extends to a height of the etch stop pad groove SPA, a cross section of the first slit insulating layer 141 may be formed as the same structure as the first slit insulating layer SIL1 shown in FIG. 3C.

Figure 8A:
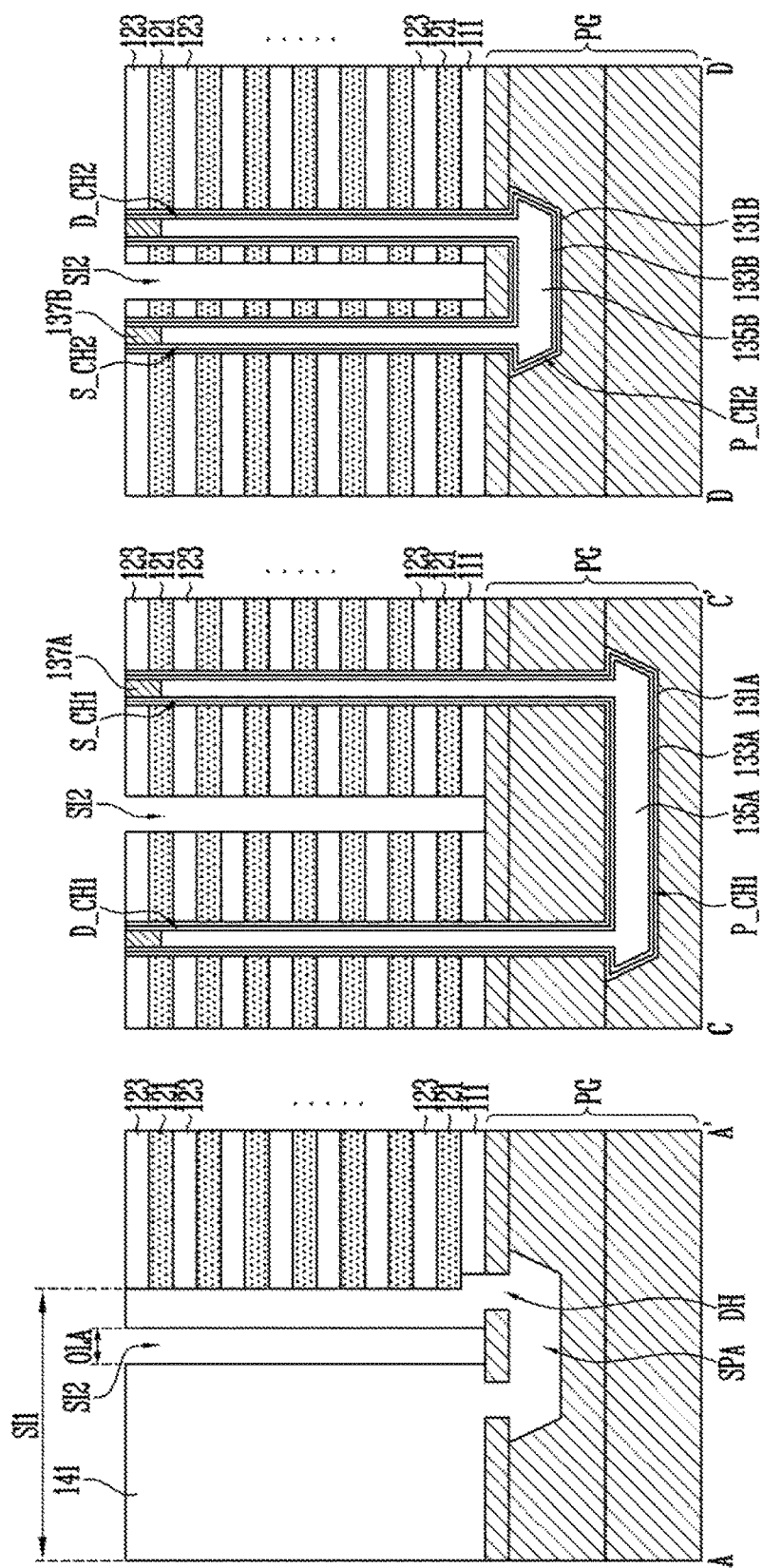
Figure 8B:
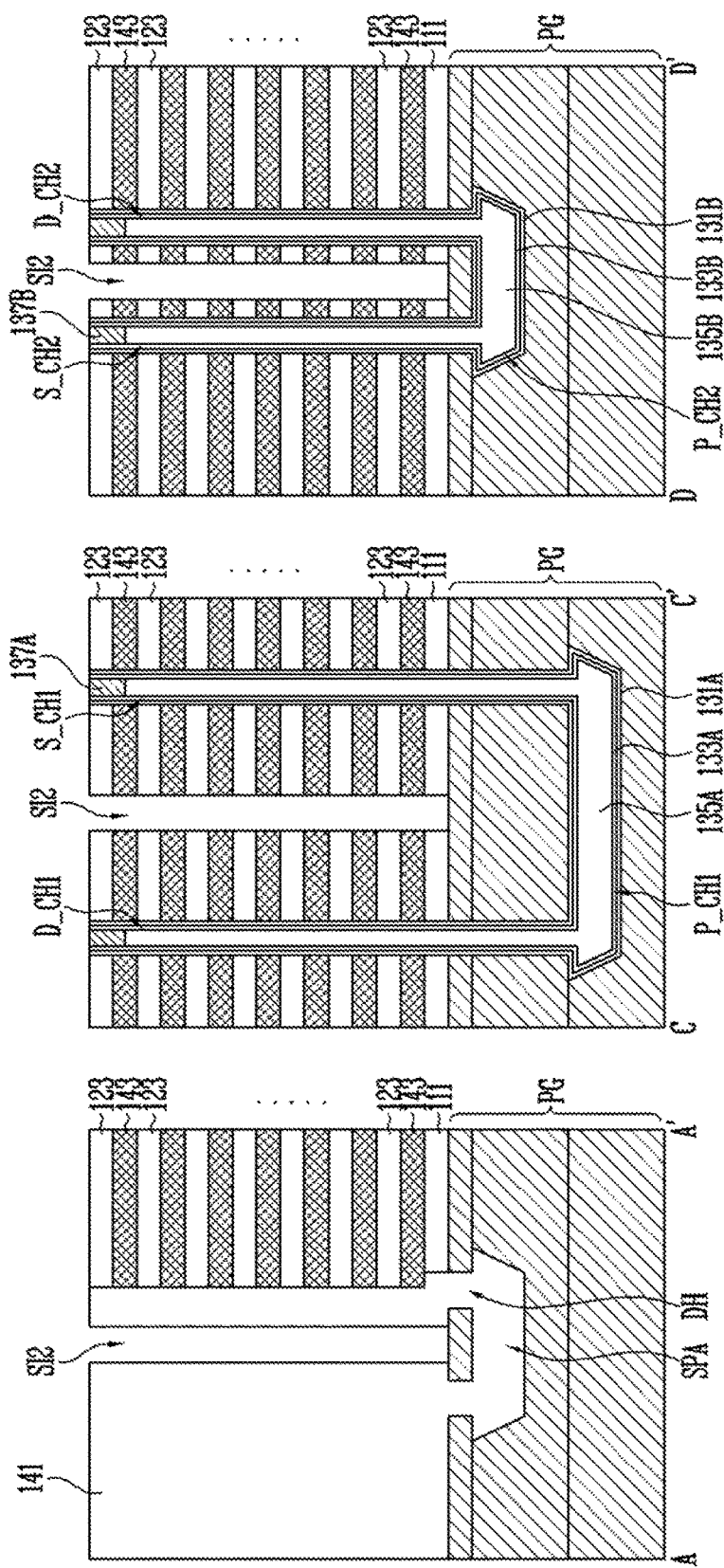

FIGS. 8A to 8C are cross sectional views for describing a process of forming a second slit insulating layer.

Referring to FIG. 8A, by etching the first material layers 121 and the second material layers 123, second slits 512 penetrating thereof may be formed. The second slits SI2 may correspond to the cell area pattern SI2A shown in FIG. 3A. Each of the second slits SI2 may extend to intersect the first slit SI1 at an overlapping portion of the first slit SI1 and the etch stop pad groove SPA.

An area in which the first slit SI1 and the second slits SI2 overlap each other may be defined as a slit overlapping area OLA. A portion of each of the second slits SI2 may extend from the slit overlapping area OLA to the inside of the first slit insulating layer 141.

Since the pipe gate PG is protected by the etch stop pattern 113A in FIG. 7A) inside the etch stop pad groove SPA during a process of forming the first slit SI1, an etch amount of the pipe gate PG in the slit overlapping area OLA is significantly reduced. Accordingly, a total etch amount of the pipe gate PG may not significantly increase even through the pipe gate PG is etched in the slit overlapping area OLA during a process for forming the second slits SI2. In addition, while forming the second slits SI2, the etch amount of the pipe gate PG in the slit overlapping area OLA may be reduced by a portion of the first slit insulating layer 141 disposed in a large thickness in the etch stop pad groove SPA.

Referring to FIG. 8B, the first material layers 121 may be replaced with conductive patterns 143 through the second slits SI2. A process of replacing the first material layers 121 with the conductive patterns 143 may include opening conductive pattern areas by removing the first material layers 121 through the second slits SI2, forming a conductive material to fill the conductive pattern areas, and separating the conductive material into the conductive patterns 143 by removing the conductive material inside the second silts SI2.

Referring to FIG. 8C, the second slits SI2 may be filled with a second slit insulating layer 145.

Figure 9:
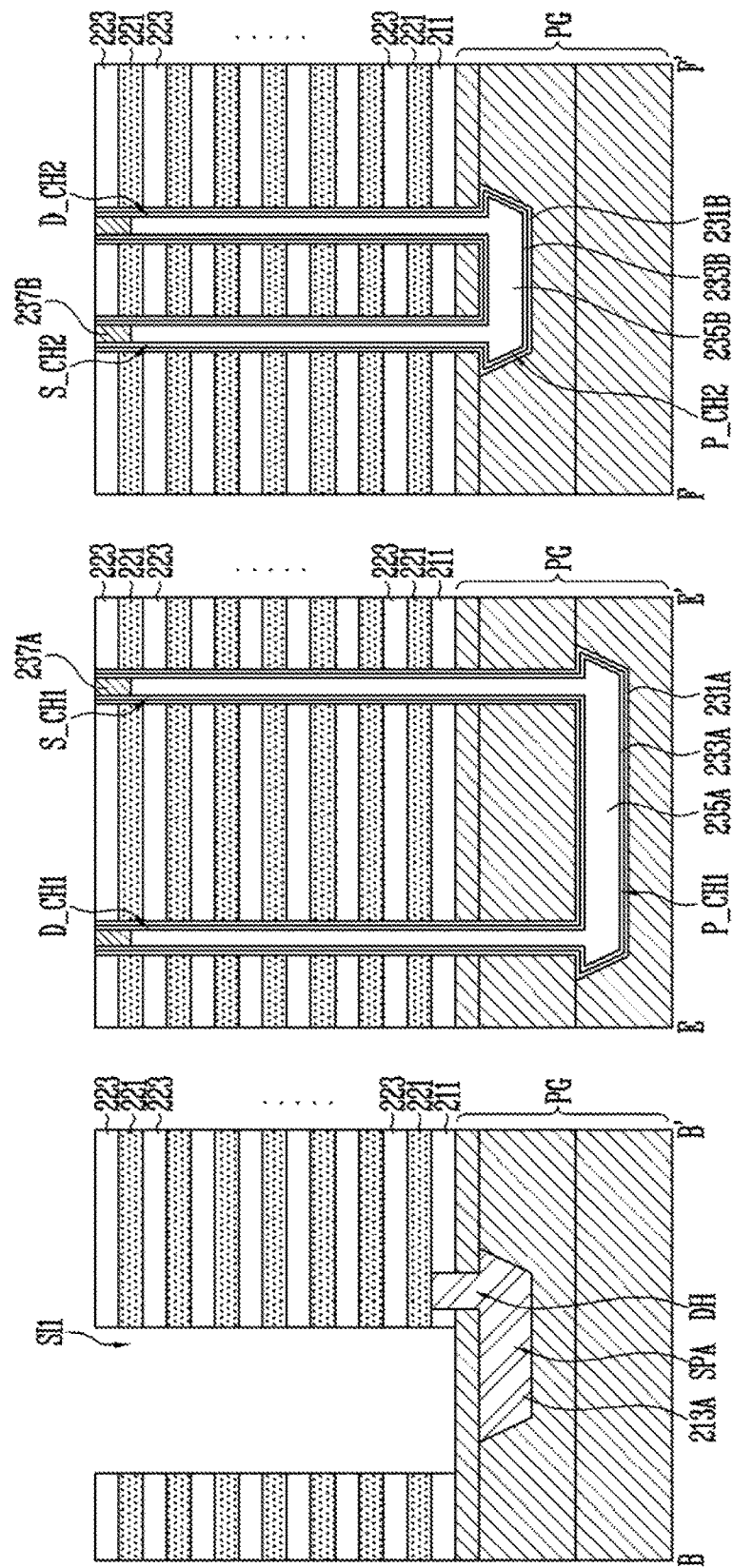
FIGS. 9 to 10C illustrate cross sectional views of manufacturing method of a memory device according to an embodiment of the present disclosure.

FIGS. 9 to 10C are cross sectional views for describing a method for manufacturing a semiconductor device according to an embodiment of the present disclosure. FIGS. 9 to 10C of are cross sectional views taken along lines A-A', E-E and F-F' illustrated in FIG. 4A.

FIGS. 9 to 10C illustrate cross sectional views for a manufacturing method of a memory device, according to an embodiment of the present disclosure.

FIG. 9 is a sectional views illustrating a process of forming a first slit SI1.

Referring to FIG. 9, a pipe gate PG in which an etch stop pattern 213A is buried may be formed by using the same processes described in FIGS. 5A to 5C. The etch stop pattern 213A may be formed to fill an etch stop pad groove SPA and a dummy hole DH connected thereto. The etch pad groove SPA may be formed in the pipe gate PG and the dummy hole DH may be connected to the etch stop pad groove SPA. The dummy hole DH may penetrate the pipe gate PG above the etch stop pad groove SPA and a first interlayer insulating layer 211 above the pipe gate PG.

An upper pipe groove PA2 may be arranged at the same height as the etch stop pad groove SPA and a lower pipe groove PA1 may be arranged at a height lower than the upper pipe groove PA2 and the etch stop pad groove SPA.

Subsequently, a lower channel layer 233A and an upper channel layer 233B may be formed by using the same process described above in FIGS. 6A and 6B, Before forming the lower channel layer 233A and the upper channel layer 233B, a first multilayer pattern 231A and a second multilayer pattern 231B may be further formed. After forming the lower channe layer 233A and the upper channel layer 233B, a first core insulating layer 235A and a second core insulating layer 235B filling each of central areas thereof may be further formed. In addition, after forming the lower channel layer 233A and the upper channel layer 233B, first doped patterns 237A contacted to both ends of the lower channel layer 233A and second doped patterns 237B contacted to both ends of the upper channel layer 233 B may be formed on each of the first core insulating layer 235A and the second core insulating layer 235B.

The lower channel layer 233A may include a lower pipe channel layer P_CH1 disposed inside the lower pipe groove PA1 a drain side lower channel pillar D_CH1 extended from the lower pipe channel layer P_CH1 and a source side lower channel pillar S_CH1 extended from the lower pipe channel layer P_CH1. The upper channel layer 233B may include an upper pipe channel layer P_CH2 disposed inside the upper pipe groove PA2, a drain side upper channel pillar D_CH2 extended from the upper pipe channel layer P_CH2, and a source side upper channel pillar S_CH2 extended from the upper pipe channel layer P_CH2.

Subsequently, by etching first material layers 221 and second material layers 223, the first slit SI1 penetrating thereof ay be formed. The first slit SI1 may correspond to the second sub pattern SI1B shown in FIG. 4A. At least a portion of the first slit SI1 may overlap the etch stop pattern 213A.

The first slit SI1 may be arranged so as not to overlap the dummy hole DH.

Figure 10B:
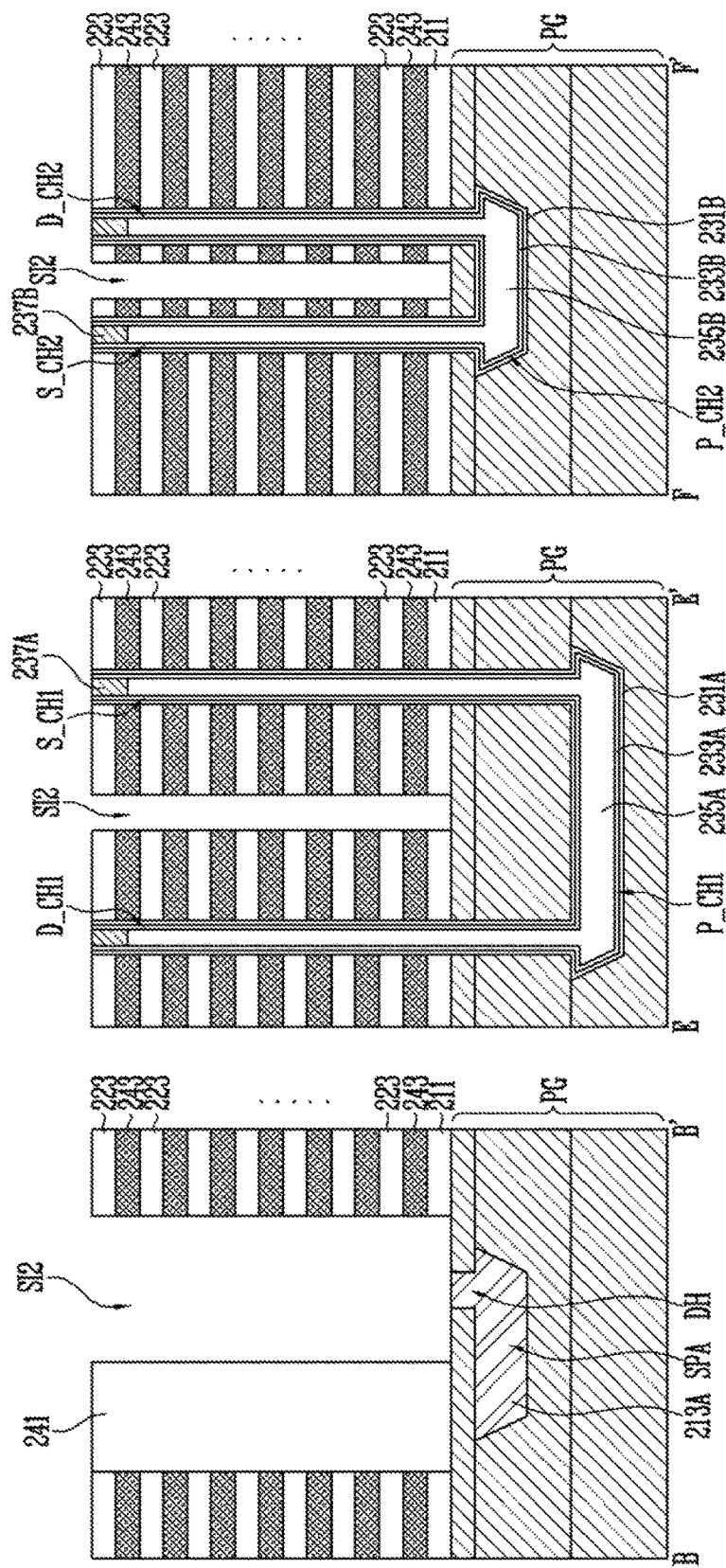

FIGS. 10A to 10C are cross sectional views for describing a method for forming a second slit insulating layer.

Referring to FIG. 10A, after filling the first slit SI1 with a first slit insulating layer 241, the second slits SI2 penetrating the first material layers 221 and the second material layers 223 may be formed by etching the first material layers 221 and the second material layers 223. The second slits SI2 may correspond to the cell area pattern SI2A shown in FIG. 4A. Each of the second slits SI2 may extend across the first slit SI1 at an overlapping portion of the first slit SI1 and the etch stop pad groove SPA.

In the slit overlapping area OLA in which the first slits SI1 overlap the second slits SI2, a portion of the second slits SI2 may extend to the inside of the first slit insulating layer 241. Each of the second slits SI2 may overlap the dummy holes DH corresponding thereto. The etch stop pattern 213A may be exposed through the second slits SI2.

During a process for forming the second slits SI2, the etch stop pattern 213A may prevent an over etch of the pipe gate PG in the slit overlapping area OLA. In particular, since the etch stop pattern 213A may be formed of a material such as, TiN having a higher etch selectivity to the first material layers 221 and the second material layers 223, than the pipe gate PG, the over etch of the pipe gate PG in the slit overlapping area OLA may be prevented more efficiently rather than in the case in which the pipe gate PG is used as an etch stop layer.

Referring to FIG. 10B, the first material layers 221 may be replaced with conductive patterns 243 through the second slits SI2. A process for replacing the first material layers 221 with the conductive patterns 243 is the same as described in FIG. 8B.

Referring to FIG. 10C, the etch stop pad groove SPA and the dummy hole DH may be opened by removing the etch stop pattern 213A through each of the second slits SI2. The etch stop pattern 213A may be removed by using sulfuric acid. Subsequently, a second slit insulating layer 245 may be formed such that the second slit insulating layer 245 fills each of the second slits SI2, the etch stop pad groove SPA and the dummy hole DH. When bottom surfaces of the first slit SI1 and the second slits SI2 extend to the height of the etch stop pad groove SPA, a cross section of the first slit insulating layer 241 and the second slit insulating layer 245 may be formed in the same structure of the first slit insulating layer SIL1 and the second silt insulating layer SIL2 illustrated in FIG. 4C.

Figure 11:
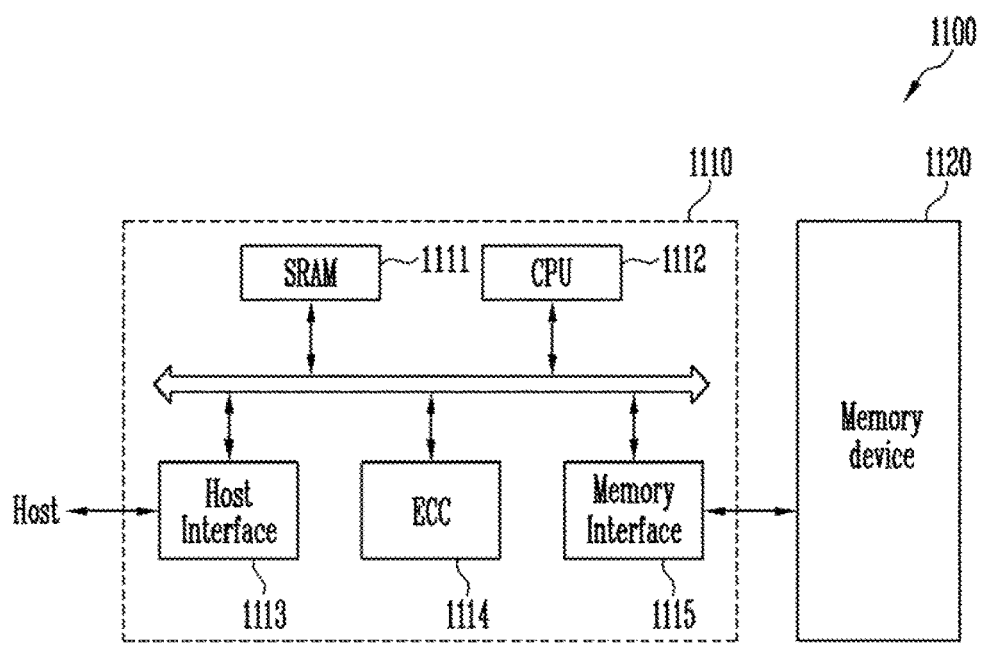
FIG. 11 illustrates a configuration view of a memory system according to an embodiment of the present disclosure.

FIG. 11 is a configuration view illustrating a memory system according to an embodiment of the present disclosure, Referring to FIG. 11, a memory system 1100 according to the embodiment of the present disclosure may include a memory device 1120 and a memory controller 1110.

The memory device 1120 may include the structure described in FIGS. 2 to 4C. For example, the memory device 1120 may include interlayer insulating layers and conductive patterns alternately stacked over a pipe gate; a first slit and a second slit penetrating the interlayer insulating layers and the conductive patterns and crossing each other; an etch stop pad groove overlapping an intersection of the first slit and the second slit, arranged in the pipe date, and connected to the first slit or the second slit; a slit insulating layer filling the first slit, the second slit and the etch stop pad groove.

The memory device 1120 may be a multichip package including a plurality of flash memory chips.

The memory controller 1110 may be configured to control the memory device 1120 and include a static random access memory (SRAM) 1111, a CPU 1112, a host interface 1113, an error correction code (ECC) 1114 and a memory interface 1115. The SRAM 1111 may be used as a working memory of the CPU 1112, the CPU 1112, may perform the various control operations for a data exchange of the memory controller 1110 and the host interface 1113 and may include a data exchange protocol of a host connecting to the memory system 1100. In addition, the ECC 1114 may detect and correct errors included in data read from the memory device 1120, and the memory interface 1115 may perform interfacing with the memory device 1120. In addition, the memory controller 1110 may further include a read only memory (ROM) for storing code data used for interfacing with the host.

The above described memory system 1100 may be a memory card in which the memory device 1120 and the controller 1110 are combined or a solid state disk SSD, For example, the memory system 1100 is the SSD, the controller 1110 may communicate with external sources for example, a host, through one of various interface protocols such as an universal serial bus (USB), a multimedia card (MMC), a peripheral component interconnection express (PCIE), a serial advanced technology attachment (SATA), a parallel advanced technology attachment (PATA), a small computer small interface (SCSI), enhanced small disk interface (ESDI), and integrated drive electronics (IDE).

Figure 12:
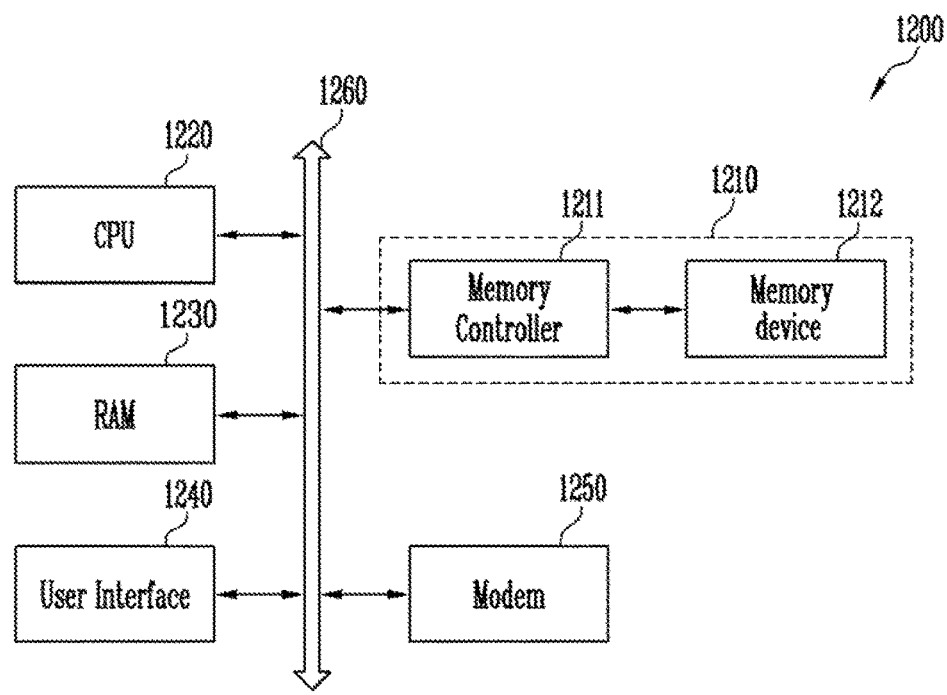
FIG. 12 illustrates a configuration view of a computing system according to an embodiment of the present disclosure.

FIG. 12 illustrates a configuration diagram of a computing system, according to an embodiment of the present disclosure.

Referring to FIG. 12, a computing system 1200 according to the embodiment of the present disclosure may include a CPU 1220, a random access memory (RAM) 1230, a user interface 1240, a modem 1250, and a memory system 1210, coupled to a system bus 1260. Further, when the computing system 1200 is a mobile device, a battery may be further included to supply an operating voltage to the computing system 1200. Additionally, an application chipset, a camera image processor CIS, and a mobile DRAM may be further included.

The memory system 1210 may include a memory device 1212 and a memory controller 1211 as described with reference to FIG. 11.

In the embodiment of the present disclosure, a space in which an etch stop pattern is formed may be provided by forming an etch stop pad groove at an overlapping portion of a first slit and a second slit. Thus, an over etch in the overlapping portion of the first slit and the second slit may be prevented through the etch stop pattern. As a result, according to the embodiment of the present disclosure, an operational reliability of a semiconductor device may be improved by reducing a leakage current at the overlapping portion of the first slit and the second slit.

The spirit of the present disclosure has been written in detail in accordance with the preferred embodiment, the above embodiment is for description purposes only and it should be noted that it is not intended to limit the present disclosure. Additionally, ordinary experts in the art will appreciate the variety of possible example embodiments available within the scope of the disclosure.

What is claimed is:

1. A semiconductor device comprising:
   interlayer insulating layers and conductive patterns alternately stacked over a pipe gate;
   a first slit and a second slit penetrating the interlayer insulating layers and the conductive patterns, and crossing each other;
   an etch stop pad groove overlapping an intersection of the first slit and the second slit, arranged in the pipe gate, and connected to the first slit or the second slit; and
   slit insulating layers filling the first slit and the second slit,
   wherein at least one of the slit insulating layers includes a bottom surface coplanar with an inner surface of the pipe gate along the etch stop pad groove and is extended to completely fill the etch stop pad groove.

2. The semiconductor device of claim 1, further comprising:
   an upper pipe groove arranged in the pipe gate extending along a first direction and a second direction which cross each other;
   an upper pipe channel layer arranged in the upper pipe groove; and
   at least one pair of upper channel pillars extended from the upper pipe channel layer to a third direction perpendicular to an upper surface of the pipe gate, and penetrating the interlayer insulating layers and the conductive patterns.

3. The semiconductor device of claim 2, wherein the etch stop pad groove is arranged at a same height as the upper pipe groove.

4. The semiconductor device of claim 2, wherein the second slit is arranged between the upper channel pillars and extends along the first direction.

5. The semiconductor device of claim 2, further comprising:

a lower pipe groove arranged in the pipe gate and spaced apart from the upper pipe groove at a lower height than the upper pipe groove;

a lower pipe channel layer arranged in the lower pipe groove; and at least one pair of lower channel pillars extending from the lower pipe channel layer in the third direction, and penetrating the interlayer insulating layers and the conductive patterns.

6. The semiconductor device of claim 5, wherein the lower pipe groove is arranged at a lower height than the etch stop pad groove.

7. The semiconductor device of claim 1, wherein the slit insulating layers comprise:

a first slit insulating layer filling the first slit and the etch stop pad groove; and a second slit insulating layer filling the second slit.

8. The semiconductor device of claim 7, further comprising:

the etch stop pad groove extending along the first slit; and a dummy hole penetrating the pipe gate between the first slit and the etch stop pad groove, wherein the dummy hole is filled with the first slit insulating layer.

9. The semiconductor device of claim 1, wherein the slit insulating layers comprise:

a first slit insulating layer filling the first slit; and a second slit insulating layer filling the second slit and the etch stop pad groove.

10. The semiconductor device of claim 9, further comprising:

the etch stop pad groove extending along the second slit; and a dummy hole penetrating the pipe gate between the second slit and the etch stop pad groove, wherein the dummy hole is filled with the second slit insulating layer.

* * * * *